US007010738B2

(12) United States Patent
Morioka et al.

(10) Patent No.: US 7,010,738 B2
(45) Date of Patent: Mar. 7, 2006

(54) COMBINATIONAL CIRCUIT, AND ENCODER, DECODER AND SEMICONDUCTOR DEVICE USING THIS COMBINATIONAL CIRCUIT

(75) Inventors: Sumio Morioka, Yamato (JP); Yasunao Katayama, Hachiouji (JP); Toshiyuki Yamane, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 717 days.

(21) Appl. No.: 10/091,774

(22) Filed: Mar. 6, 2002

(65) Prior Publication Data

US 2003/0063554 A1 Apr. 3, 2003

(30) Foreign Application Priority Data

Mar. 9, 2001 (JP) .............................. 2001-066573
Jun. 28, 2001 (JP) .............................. 2001-196027

(51) Int. Cl.
*H03M 13/00* (2006.01)

(52) U.S. Cl. ....................... 714/752; 714/781; 708/492

(58) Field of Classification Search ................ 714/754, 714/752, 784, 781, 786, 758, 52, 774; 398/9; 713/167; 708/492
See application file for complete search history.

(56) References Cited

U.S. PATENT DOCUMENTS 5,107,503 A * 4/1992 Riggle et al. ............... 714/784
6,327,654 B1 * 12/2001 Oowaki et al. ............. 713/167
6,718,138 B1 * 4/2004 Sugawara ...................... 398/9

* cited by examiner

*Primary Examiner*—Albert Decady
*Assistant Examiner*—Dipakkumar Gandhi
(74) *Attorney, Agent, or Firm*—Ido Tuchman

(57) ABSTRACT

A combinational circuit comprises: a plurality of multipliers, independently performing two or more multiplications for coded digital signals in a Galois extension field $GF(2^m)$ (m is an integer equal to or greater than 2), wherein the multipliers include an input side XOR calculator, an AND calculator, and an output side XOR calculator, and wherein the multipliers share the input side XOR calculator. Further, according to the present invention, these multipliers each include an adder connected between an AND calculator and an output side XOR calculator, wherein the output side XOR calculator is used in common, and wherein the outputs of the AND calculators in the multipliers are added by the adders, and the addition results are calculated by the output side XOR calculator that is used in common.

19 Claims, 20 Drawing Sheets

$$\tilde{\Lambda}_1^{(1)} = S_1$$

$$\tilde{\Lambda}_0^{(1)} = S_0$$

Case where $l$ = 2

$$\tilde{\Lambda}_2^{(2)} = \tilde{\Lambda}_1^{(1)} S_3 + S_2^2$$

$$\tilde{\Lambda}_1^{(2)} = \tilde{\Lambda}_0^{(1)} S_3 + \tilde{\Lambda}_1^{(1)} S_2$$

$$\tilde{\Lambda}_0^{(2)} = \tilde{\Lambda}_0^{(1)} S_2 + \tilde{\Lambda}_1^{(1)} S_1$$

Case where $l$ = 3

$$\tilde{\Lambda}_3^{(3)} = \tilde{\Lambda}_2^{(2)} S_5 + S_1 S_4^2 + S_3^3$$

$$\tilde{\Lambda}_2^{(3)} = \tilde{\Lambda}_1^{(2)} S_5 + \tilde{\Lambda}_2^{(2)} S_4 + S_0 S_4^2 + S_2 S_3^2$$

$$\tilde{\Lambda}_1^{(3)} = \tilde{\Lambda}_0^{(2)} S_5 + \tilde{\Lambda}_1^{(2)} S_4 + \tilde{\Lambda}_2^{(2)} S_3$$

$$\tilde{\Lambda}_0^{(3)} = \tilde{\Lambda}_0^{(2)} S_4 + \tilde{\Lambda}_1^{(2)} S_3 + \tilde{\Lambda}_2^{(2)} S_2$$

Case where $l$ = 4

$$\tilde{\Lambda}_4^{(4)} = \tilde{\Lambda}_3^{(3)} S_7 + \tilde{\Lambda}_2^{(2)} S_6^2 + S_4^4 + S_3 S_4^2 S_5 + S_3^2 S_5^2 + S_1 S_5^3$$

$$\tilde{\Lambda}_3^{(4)} = \tilde{\Lambda}_2^{(3)} S_7 + \tilde{\Lambda}_3^{(3)} S_6 + \tilde{\Lambda}_1^{(2)} S_6^2 + S_3 S_4^3 + S_2 S_4^2 S_5 + S_1 S_4 S_5^2 + S_0 S_5^3$$

$$\tilde{\Lambda}_2^{(4)} = \tilde{\Lambda}_1^{(3)} S_7 + \tilde{\Lambda}_2^{(3)} S_6 + \tilde{\Lambda}_3^{(3)} S_5 + \tilde{\Lambda}_0^{(2)} S_6^2 + S_3^2 S_4^2 + S_2 S_4^3 + S_2^2 S_5^2 + S_0 S_4 S_5^2$$

$$\tilde{\Lambda}_1^{(4)} = \tilde{\Lambda}_0^{(3)} S_7 + \tilde{\Lambda}_1^{(3)} S_6 + \tilde{\Lambda}_2^{(3)} S_5 + \tilde{\Lambda}_3^{(3)} S_4$$

$$\tilde{\Lambda}_0^{(4)} = \tilde{\Lambda}_0^{(3)} S_6 + \tilde{\Lambda}_1^{(3)} S_5 + \tilde{\Lambda}_2^{(3)} S_4 + \tilde{\Lambda}_3^{(3)} S_3.$$

Fig. 14

PRIOR ART $$\Lambda_i^{(l)} = \frac{\tilde{\Lambda}_i^{(l)}}{\tilde{\Lambda}_0^{(l)}}, \quad i = 1, \cdots, l$$

$$\tilde{\Lambda}_0^{(l)} = \begin{vmatrix} S_0 & \cdots & S_{l-1} \\ \vdots & \ddots & \vdots \\ S_{l-1} & \cdots & S_{2l-2} \end{vmatrix},$$

$$\tilde{\Lambda}_i^{(l)} = \begin{vmatrix} S_0 & \cdots & S_{l-1} \\ \vdots & \ddots & \vdots \\ S_{l-i-1} & \cdots & S_{2l-i-2} \\ S_{l-i+1} & \cdots & S_{2l-i} \\ \vdots & \ddots & \vdots \\ S_l & \cdots & S_{2l-1} \end{vmatrix}, \quad i = 1, \cdots, l-1$$

$$\tilde{\Lambda}_l^{(l)} = \begin{vmatrix} S_1 & \cdots & S_l \\ \vdots & \ddots & \vdots \\ S_l & \cdots & S_{2l-1} \end{vmatrix}.$$

Fig. 15

$$\Gamma_0^{(l+1)} = \begin{vmatrix} s_0 & s_1 & \cdots & s_{l-1} \\ s_1 & \ddots & & \vdots \\ \vdots & & \ddots & \vdots \\ s_{l-1} & \cdots & \cdots & s_{2l-2} \end{vmatrix},$$

$$\Gamma_i^{(l+1)} = \begin{vmatrix} s_0 & \cdots & s_{l-1-i} & s_{l+1-i} & \cdots & s_l \\ \vdots & & \vdots & \vdots & & \vdots \\ s_{l-1-i} & \cdots & s_{2(l-1-i)} & s_{2(l-i)} & \cdots & s_{2l-1-i} \\ s_{l+1-i} & \cdots & s_{2(l-i)} & s_{2(l+1-i)} & \cdots & s_{2l+1-i} \\ \vdots & & \vdots & \vdots & & \vdots \\ s_l & \cdots & s_{2l-1-i} & s_{2l+1-i} & \cdots & s_{2l} \end{vmatrix} \qquad i = 1, \cdots, l-1$$

$$\Gamma_l^{(l+1)} = \begin{vmatrix} s_2 & \cdots & \cdots & s_{l+1} \\ \vdots & \ddots & & \vdots \\ \vdots & & \ddots & \vdots \\ s_{l+1} & \cdots & \cdots & s_{2l} \end{vmatrix}.$$

Fig. 16

$$\Gamma_0^{(1)} = 1$$

$$\Gamma_0^{(2)} = S_0$$
$$\Gamma_1^{(2)} = S_2$$

$$\Gamma_0^{(3)} = S_0 S_2 + S_1^2$$
$$\Gamma_1^{(3)} = S_0 S_4 + S_2^2$$
$$\Gamma_2^{(3)} = S_2 S_4 + S_3^2$$

$$\Gamma_0^{(4)} = \Gamma_0^{(3)} S_4 + S_0 S_3^2 + S_2^3$$
$$\Gamma_1^{(4)} = \Gamma_0^{(3)} S_6 + S_0 S_4^2 + S_2 S_3^2$$
$$\Gamma_2^{(4)} = \Gamma_1^{(3)} S_6 + S_0 S_5^2 + S_4 S_3^2$$
$$\Gamma_3^{(4)} = \Gamma_2^{(3)} S_6 + S_2 S_5^2 + S_4 S_4^2$$

$$\Gamma_0^{(5)} = \Gamma_0^{(4)} S_6 + \Gamma_0^{(3)} S_5^2 + \Gamma_1^{(3)} S_4^2 + \Gamma_2^{(3)} S_3^2$$
$$\Gamma_1^{(5)} = \Gamma_0^{(4)} S_8 + \Gamma_0^{(3)} S_6^2 + \Gamma_1^{(3)} S_5^2 + \Gamma_2^{(3)} S_4^2$$
$$\det 03 = S_0 S_6 + S_3^2$$
$$\det 24 = S_2 S_6 + S_4^2$$
$$\Gamma_2^{(5)} = \Gamma_1^{(4)} S_8 + \Gamma_0^{(3)} S_7^2 + \det 03 \cdot S_5^2 + \det 24 \cdot S_4^2$$
$$\det 45 = S_4 S_6 + S_5^2$$
$$\Gamma_3^{(5)} = \Gamma_2^{(4)} S_8 + \Gamma_1^{(3)} S_7^2 + \det 03 \cdot S_6^2 + \det 45 \cdot S_4^2$$
$$\Gamma_4^{(5)} = \Gamma_3^{(4)} S_8 + \Gamma_2^{(3)} S_7^2 + \det 24 \cdot S_6^2 + \det 45 \cdot S_5^2$$
$$\Gamma_0^{(6)} = \Gamma_0^{(5)} S_8 + \Gamma_0^{(4)} S_7^2 + \Gamma_1^{(4)} S_6^2 + \Gamma_2^{(4)} S_5^2 + \Gamma_3^{(4)} S_4^2.$$

Fig. 17

COMBINATIONAL CIRCUIT, AND ENCODER, DECODER AND SEMICONDUCTOR DEVICE USING THIS COMBINATIONAL CIRCUIT

BACKGROUND OF THE INVENTION

1. Field of the Invention

The present invention relates to a combinational circuit, and an encoder, a decoder and a semiconductor device that use this combinational circuit. More specifically, the present invention relates to a combinational circuit that can effectively correct errors, especially in a fast optical communication field, and an encoder, a decoder and a semiconductor device that use this combinational circuit.

2. Brief Description of the Prior Art

Importance of Fast and Superior Error Correction Technique

In consonance with the expansion of the Internet and the development of e-business, the rate of increase in the volume of data computers can handle and their speed has accelerated. Accordingly, there is a demand for increasing speed of data transfer among computers, and in line with this demand, optical communication that yields transfer speed of up to 40 Gbps is becoming popular. However, for such a fast communication method such as the optical communication method, to maintain an acceptable error rate at system level requires that the reliability of data communication be further increased in proportion to the amount of data processed by a computer.

Important techniques, called error correction coding techniques, have been devised to improve data reliability employing high-level mathematics to automatically correct errors caused by a variety of factors (e.g., noise along a channel). Popular known techniques are Hamming code and Reed-Solomon code, both of which are frequently employed. Basically, Hamming codes correct single bit errors, but their correction capability is low. For instance, with Hamming codes, if a single bit error is detected, the error is corrected, but if the detected error covers two bits, only the error detection portion of the process is performed, no correction is made. However, setting up an error correction process for an error correction system using Hamming code is simple, and it is well known that by performing the error correction process in parallel, a processing speed that greatly exceeds 1 Gbps (one billion bits per second) can be obtained.

On the other hand, Reed-Solomon code is a superior error correction technique possessing high correction capabilities and can be used to correct errors appearing as units (symbols) comprising multiple contiguous bits. At present, however, because of the complicated calculations that are frequently required, using Reed-Solomon code to perform correction processes in parallel is difficult; and even when pipeline processes using data having eight-bit width are performed at 100 MHz, for example, only processing speed of around 800 Mb/s can be obtained. Currently, therefore, since the speed attainable with conventional techniques using Reed-Solomon codes is not suitable for fields in which high processing speed is required, these techniques are employed mainly for fields to which comparatively low data processing speed is acceptable, such as the low speed communication field and the data storage-unit field for the production of hard disks or secondary storage devices, CD-ROMs, for example.

Error Correction Technique Required by a Fast Optical Communication Field

As part of a fast optical communication technique for data communication by computers, by the recently popular Internet as a backbone, a terabit per second fast communication system that employs WDM (Wavelength Division Multiplexing) and DWDM (Dense WDM), which has improved wavelength division multiplexing levels, has been introduced based on the SONET technique, according to which frames having a predetermined length are synchronously and sequentially transmitted.

As the wavelength division multiplexing levels for the above described optical data communication is increased, crosstalk occurs between wavelengths that are near each other. To cope with this crosstalk, FEC (Forward Error Correction) is employed as an error correction method for communication in long distance (Long Haul) optical wavelength division multiplexing. In ITU-T G.975, the ITU (International Telecommunication Union) standardized the use of interleaved (255, 239)RS code (code length n=255 bytes) of m=8 (8 bits/symbols), and in G.709, the Digital Wrapper standard for defining the FEC frame structure is employed.

According to the Digital Wrapper standard, for example, low-speed serial Reed-Solomon code circuits are arranged in parallel to achieve a necessary processing capability, and for this, interleaving of Reed-Solomon codes is an indispensable technique.

Prior Art for Fast and High-Level Error Correction Techniques

Independent of the need for optical communication, parallel fast decoding using Reed-Solomon code has been studied using a combinational circuit.

FIG. 1 is a diagram showing an example of a fast decoder that can be used for an error correction apparatus. The decoding circuit in FIG. 1 implements a procedure for increasing by a multiple of ten or more the decoding speed of one decoding circuit, and for performing, at substantially the comparable speed as that of Humming code, parallel decoding in an error correction process using the Reed-Solomon coding possessing high-level error correction capabilities. For the decoding circuit in FIG. 1, a new representation using the elementary symmetric functions is employed for decoding Reed-Solomon codes, so that an error value polynomial Er(x) of 0(t)-degree with which error values can be directly calculated is employed (t is the maximum number of correctable errors).

Since the decoding circuit in FIG. 1 employs this polynomial, not only syndrome calculation and error location evaluation, but also error value evaluation can be directly obtained by performing calculations for a single polynomial. Therefore, compared with the conventional methods whereby these calculations are performed by Forney algorithm to divide evaluation results obtained for two polynomials, a greatly simplified operation can be used. Further, in the decoding circuit in FIG. 1, a representation appropriate for a combinational circuit is employed not only for the calculation of the coefficients of Er(x), but also for the calculation of the coefficients of the error locator polynomial $\Lambda(x)$, so that not only can a higher processing speed be provided, but in addition, the number of required arithmetic circuits can be reduced.

When the decoding circuit in FIG. 1 is employed, a random 4-byte error correction circuit, which is mounted on an experimental base for a semiconductor using the standard 0.35 $\mu$m ASIC technique, can process in parallel, and at a low latency (45 ns), data having a 320-bit width, and a processing speed of 7 Gb/s (7 billion bits per second) can be obtained that is nearly ten times higher than the typical processing speed of 800 Mb/s available with a current serial decoding circuit. In addition, when a new circuit optimization algorithm specifically prepared for a large parallel error correction circuit and a circuit sharing method are employed for the decoding circuit in FIG. 1, the circuit size can be reduced. And furthermore, since the decoding circuit in FIG. 1 is a combinational circuit that does not require an external controller and registers, in spite of the high processing speed that can be attained, power consumption can be reduced.

However, the decoding circuit in FIG. 1 can not provide a processing speed that equals 40 Gbps required for optical communication, and in order to cope with the 8-byte error correction standard established by the ITU, when the normal circuit sharing method is used the resulting circuit can be so large that it can not be mounted on a single chip.

FIG. 2 is a schematic diagram showing the configuration of an error correction circuit that employs a conventional low-speed decoding method for optical communication. With this configuration, as the communication speed of an optical communication field increases, the conventional method whereby low-speed serial Reed-Solomon decoders are arranged in parallel becomes ever more inappropriate. Through conventional RS decoders have a processing speed below 1 Gbps, the decoding method in FIG. 2 achieves the necessary processing speed by an appropriate arrangement of low-speed serial Reed-Solomon decoders. However, according to the conventional method in FIG. 2, for such an arrangement of many Reed-Solomon decoders are required, and accordingly, the circuit size is increased in direct proportion to the data transfer speed used for optical communication. FIG. 3 is a graph showing circuit size and data transfer speed plotted when the decoding method in FIG. 2 is employed.

FIG. 4 is a diagram showing another conventional decoding circuit (A. Patel, IBM J. Res. Develop., vol. 30, pp. 259–269, 1986). Since according to this conventional decoding method, the processing speed can be easily increased for the calculation of syndromes and error locations. However, since as is shown in FIG. 4 Forney algorithm is employed for the calculation of error value, two polynomials, i.e., the differential $d\Lambda(x)/dx$ for the error locator polynomial and the error evaluator polynomial $\Omega(x)$, which are obtained by the syndromes and the error locator polynomial, must be evaluated, and then divisions must be performed. This is a critical path that prevents an increase in output speed, and the processing speed can not be satisfactorily increased.

According to OC-768 SONET, this is a large problem, because assuming the 16 interleave defined by ITU-G709 is employed as an input/output interface for the decoding circuit, a fast processing speed of 300 MHz or higher is expected. Therefore, as one attempt, the decoder in FIG. 4 is employed and divisions corresponding to the critical path are converted into detailed pipelines to increase output speed.

However, even when the process is converted into a pipeline, the decoding circuit in FIG. 4 must perform divisions at locations whereat no error is present, and the circuit size and the power consumption are increased as the pipeline is constructed. Further, to perform divisions only for error locations, the locations must be calculated in advance, so that the error locations and the error values can not be calculated in parallel. In addition, for the decoding circuit in FIG. 4, a cycle count required for the output of the error values differs depending on whether an error is present. Therefore, when a synchronous frame, such as SONET, for sequential data must be input or output at high speed, it is difficult to output error values at high speed for a constant cycle, without depending on error patterns (number of errors and their locations).

FIG. 5 is a diagram showing an additional conventional decoder. When the parallel Reed-Solomon decoding method in FIG. 1 is employed for the optical communication field, because its circuit processing capability is superior to those of other conventional methods no problem occurs when non-interleaved RS code is used for an application. However, for interleaved Reed-Solomon codes, as defined by ITU-T G.975, since signals must be rearranged using a large, high-speed buffer and selector, the parallel Reed-Solomon decoding method is not always efficient. That is, the length of (255, 239)RS code is 2040 bits, and when a 16-byte interleaving process is performed, a 16-byte input and 255-byte output serial/parallel converter and a parallel/serial converter for a 255-byte input and a 16-byte output are required, thereby considerably increasing the size of a circuit even though the processing speed can be increased to a required level. Therefore, it is difficult for the parallel Reed-Solomon decoding method to he provided at a practical level for optical communication.

For the calculation of error locations and error values used for the decoder, a large number of calculations in the Galois extension field $GF(2^m)$ must be performed at high speed, and further, the size of a circuit that can perform this processing must be such that it facilitates the implementation of the circuit. Conventionally, in the studies of the calculations over a Galois field, it is important that how efficiently a single calculation (multiplication or division) can be performed, and the several tens to hundreds of calculations by a combinational circuit have almost never been discussed to date. As one of various reasons this has not been done, it may be presumed many decoding operations tend to be performed by sequential circuits, and it has been ascertained that the use of a combinational circuit provides little merit in terms of processing capabilities and an acceptable circuit size.

During the studies of the error correction calculation algorithm, the Yule-Walker equation that is defined for the Galois extension field $GF(2^m)$ is generated in decoding of the Reed-Solomon codes. The efficient processing of this Yule-Walker equation is desirable if high-speed processing is to be achieved and the size of the necessary circuit is to be minimized. When the algorithm for solving the Yule-Walker equation is performed by a combinational circuit to achieve high-speed processing, in as the required error correction capabilities increase, the portion of the circuit used to solve the Yule-Walker equation and to locate errors becomes very significant from the viewpoint of the reduction in the size of the combinational circuit.

In addition, when a combinational circuit that can carry out the decoding of Reed-Solomon codes is applied for an actual system, it is preferable that an algorithm be provided that can be applied for the decoding of Reed-Solomon codes having an arbitrary minimum distance in order to obtain a process that can be widely used and to remove superfluous, additional circuits or processes. Especially in the optical communication field, since the use of (255, 239) Reed-Solomon code is standardized by the ITU, an algorithm is required that can efficiently decode the Reed-Solomon code where the maximum number of correctable errors is 8 and the minimum distance is 17.

In order to solve the mathematical problem posed by the Yule-Walker equation by using a hardware combinational circuit having a size that permits it to be implemented, increase in the circuit size must be suppressed, and an algorithm that can reduce the number of multipliers and a combinational circuit that can efficiently employ this algorithm are required. That is, a combinational circuit is needed that has an implementable size and that performs high-speed processing, and that includes the error correction device and the error correction algorithm described above.

SUMMARY OF THE INVENTION

To resolve the above shortcomings, it is one object of the present invention to provide an efficient combinational circuit for processing interleaved Reed-Solomon codes, and a signal processor and a semiconductor device that use this combinational circuit, for fast optical communication (40 Gbps or higher), or more specifically, for SONET using wavelength division multiplexing communication, in which sequential data are transferred as synchronous frames.

That is, according to the invention, a combinational circuit, which has a high processing capability (low latency and high throughput), and an encoder, a decoder and a semiconductor device that employ the combinational circuit are provided.

It is another object of the present invention to provide a flexible combinational circuit that can process interleaved Reed-Solomon codes without losing the above described characteristics, and an encoder, a decoder and a semiconductor device that employ the combinational circuit.

It is an additional object of the present invention to provide a combinational circuit that sequentially outputs error words at high speed and at a constant cycle rate, regardless of error patterns (error values and error locations) of each interleaved received word, and an encoder, a decoder and a semiconductor device that employ the combinational circuit.

It is a further object of the present invention to provide a combinational arithmetic circuit, circuits over a Galois extension field $GF(2^m)$ (m is an arbitrary natural number equal to or greater than 2), that has several common inputs and performs multiple multiplications (e.g., AB, AC and AD) and a circuit that performs the logical sums such as AB+CD+EF+ . . . can be implemented as small, fast and efficient processing circuits, and to provide an encoder, a decoder and a semiconductor device that employ the combinational circuit.

To perform the decoding of Reed-Solomon codes by a combinational circuit and to apply this combinational circuit to an actual system, it is a still further object of the present invention to provide a combinational circuit that can provide a flexible process that can be applied for the decoding of Reed-Solomon codes having an arbitrary minimum distance and interleave configurations without an additional circuit or process being required, and to provide an encoder, a decoder and a semiconductor device that employ the combinational circuit.

The above objects can be achieved by providing a combinational circuit according to the present invention, and an encoder, a decoder and a semiconductor device that employ the combinational circuit.

According to the present invention, a combinational circuit comprises:

a plurality of multipliers, independently performing two or more multiplications for coded digital signals in a Galois extension field $GF(2^m)$ (m is an integer equal to or greater than 2), wherein the multipliers include an input side XOR calculator, an AND calculator, and an output side XOR calculator, and wherein the multipliers share the input side XOR calculator. In the combinational circuit of this invention, the input of the multipliers is commonly used. The combinational circuit is used for an error location calculator that calculates error locations for a digital signal transmitted using wavelength division multiplexing, and for an error value calculator. Syndromes obtained by the coded digital signal are input. The combinational circuit of this invention is used for decoding, error correction or encryption. The combinational circuit of the invention is used for a coding circuit and a decoding circuit for cryptography.

According to the invention, a combinational circuit performing logical sums for a Galois extension field $GF(2^m)$ (m is an integer equal to or greater than 2) comprises: a plurality of multipliers, each of which includes an adder connected between an AND calculator and an output side XOR calculator, wherein the output side XOR calculator is used in common, and wherein the outputs of the AND calculators in the multipliers are added by the adders, and the addition results are calculated by the output side XOR calculator that is used in common. In the combinational circuit of this invention, the input of the multipliers is commonly used, and the input side XOR calculator is used in common by the multipliers. The combinational circuit is used for an error location calculator, for calculating error locations for a digital signal transmitted using wavelength division multiplexing, and for an error value calculator. Syndromes obtained by the coded digital signal is input. The combinational circuit of this invention is used for decoding, error correction or encryption.

Further, according to the invention, an encoder and a decoder including the combinational circuit are provided.

According to the invention, a semiconductor device used for processing a digital signal comprises:

input means, for receiving a coded digital signal;

processing means, for processing the coded digital signal and for calculating coefficients of an error locator polynomial and coefficients of an error value polynomial; and output means, for outputting a digital signal by correcting errors using the error locator polynomial and the error value polynomial, wherein the input means is constituted by a sequential circuit, and the processing means is constituted by a combinational circuit. In this invention, the combinational circuit comprises:

a plurality of multipliers, independently performing two or more multiplications for coded digital signals over a Galois extension field $GF(2^m)$ (m is an integer equal to or greater than 2), wherein the multipliers include an input side XOR calculator, an AND calculator, and an output side XOR calculator, and wherein the multipliers share the input side XOR calculator. Further, in this invention, the combinational circuit comprises: a logical sum calculator for a Galois extension field $GF(2^m)$ (m is an integer equal to or greater than 2), and the multipliers each include an adder connected between the AND calculator and the output side XOR calculator, wherein the output side XOR calculator is used in common, and wherein the outputs of the AND calculators in the multipliers are added by the adders, and the addition results are calculated by the output side XOR calculator that is used in common. In the semiconductor device of the invention, the input of the multipliers is commonly used, and the input side XOR calculator is used in common by the multipliers. The combinational circuit is used for an error location calculator, for calculating error locations for a digital signal transmitted using wavelength division multiplexing, and for an error value calculator. The semiconductor device of this invention is used for decoding, error correction or encryption.

BRIEF DESCRIPTION OF THE DRAWINGS

FIG. 14 is a diagram showing a conventional error locator polynomial.

FIG. 15 is a diagram of a formula, according to the invention, established for the Yule-Walker equation.

FIG. 16 is a diagram showing the detailed structure of $\Gamma_i^{(l+1)}$ according to the invention.

FIG. 17 is a diagram showing the detailed calculation results obtained, according to the invention, for decoding Reed-Solomon code.

DETAILED DESCRIPTION OF THE INVENTION

The preferred embodiment of the present invention will now be described by referring to the accompanying drawings. Note, however, that the present invention is not limited to this embodiment.

Section 1 Decoding Circuit

Figure 1:
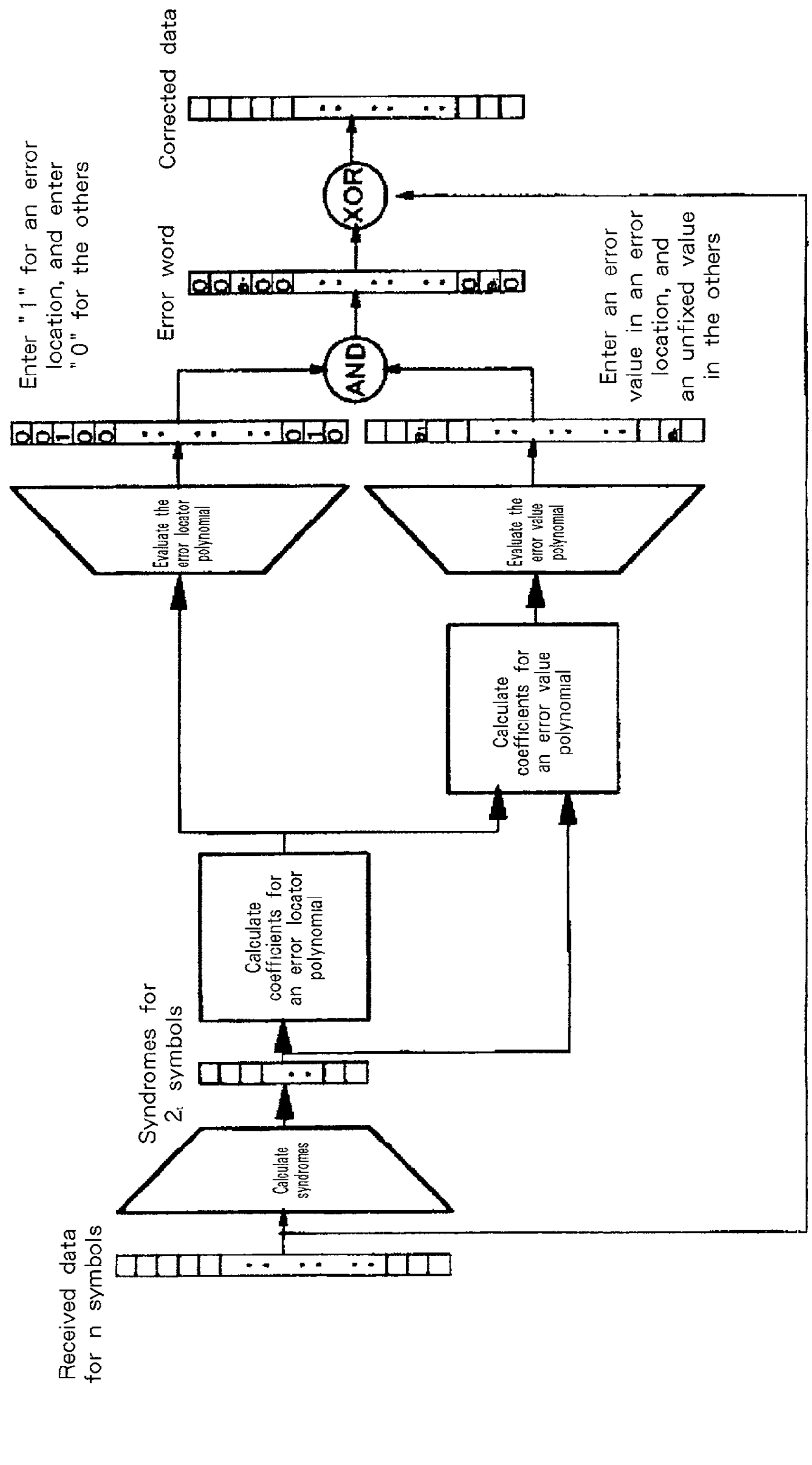
FIG. 1 is a diagram showing a conventional decoder.
Figure 2:
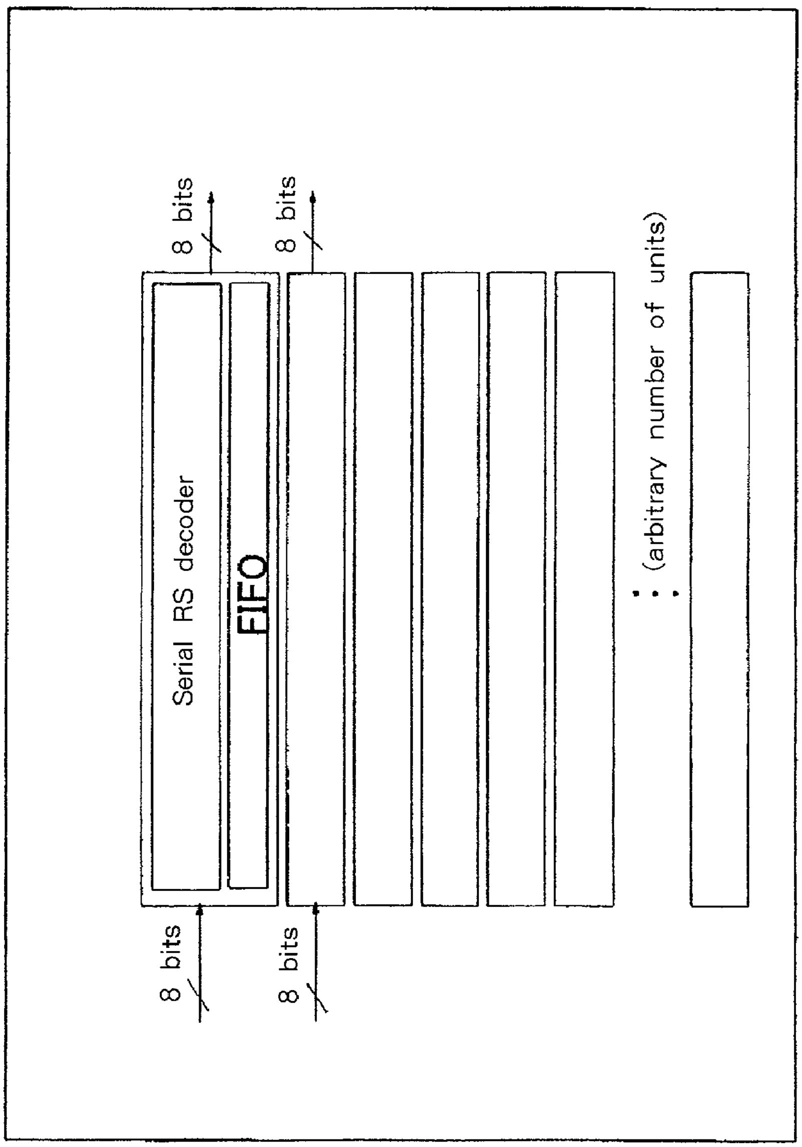
FIG. 2 is a diagram showing a conventional error correction device for optical communication.
Figure 3:
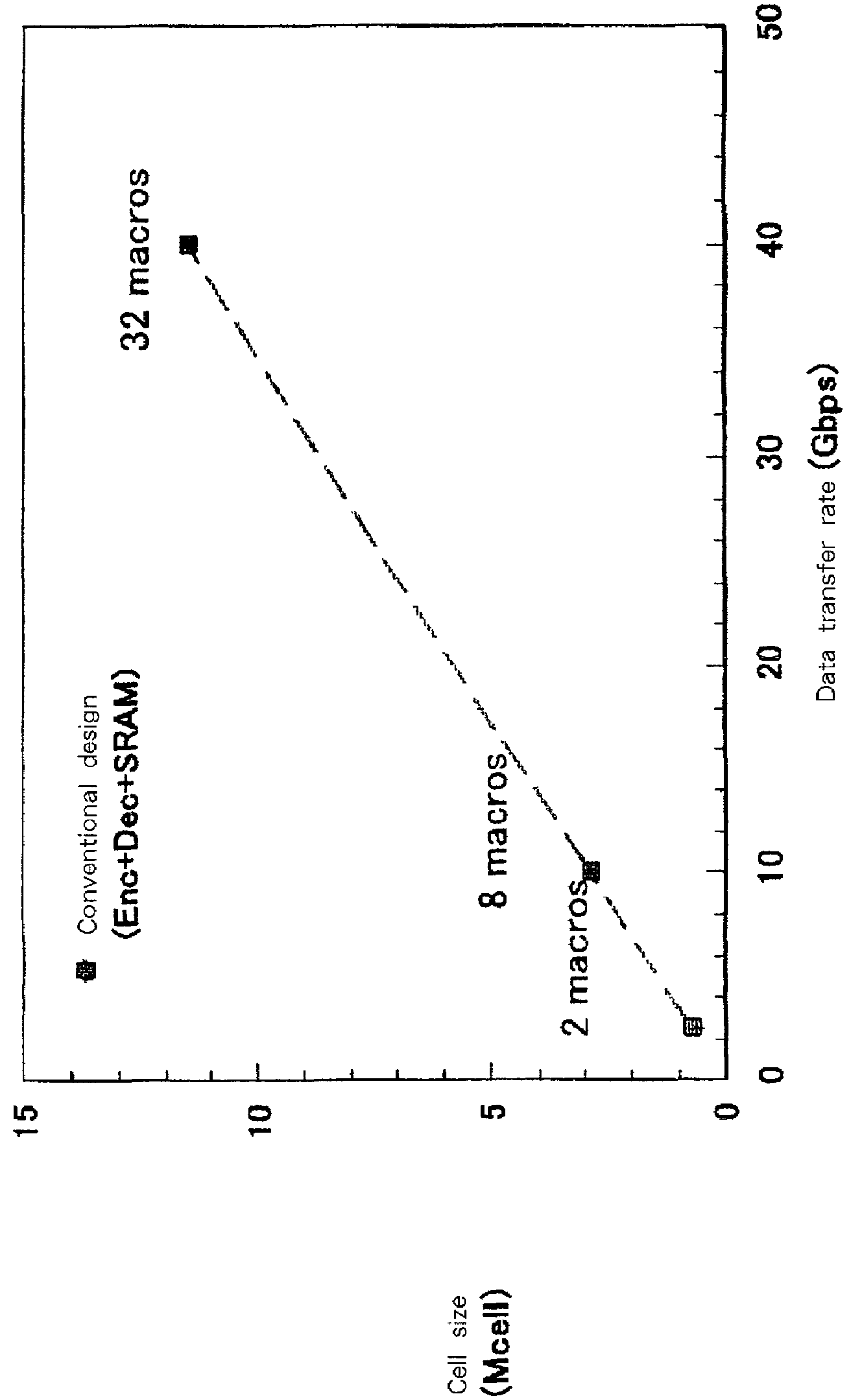
FIG. 3 is a graph obtained by plotting a conventional circuit size and a data transfer speed.
Figure 4:
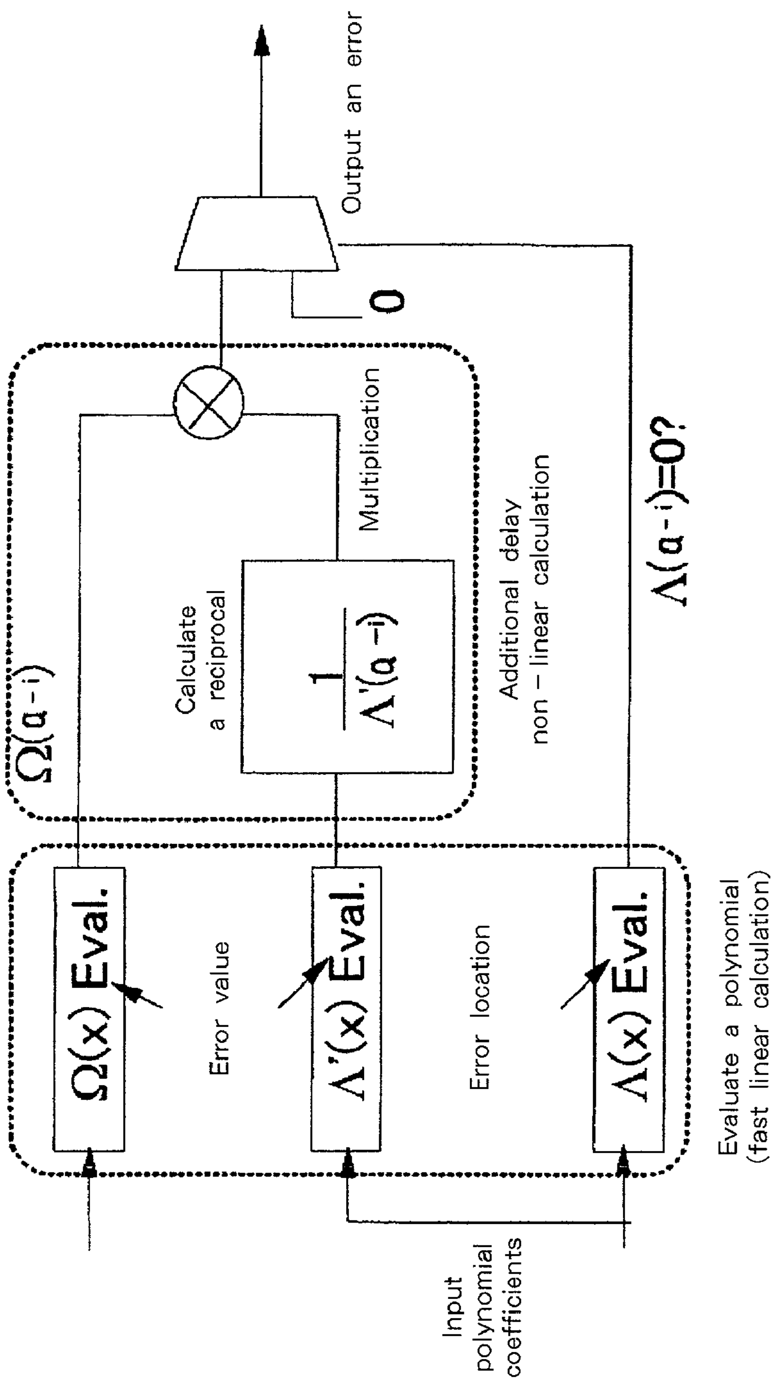
FIG. 4 is a diagram showing another conventional decoding circuit.
Figure 5:
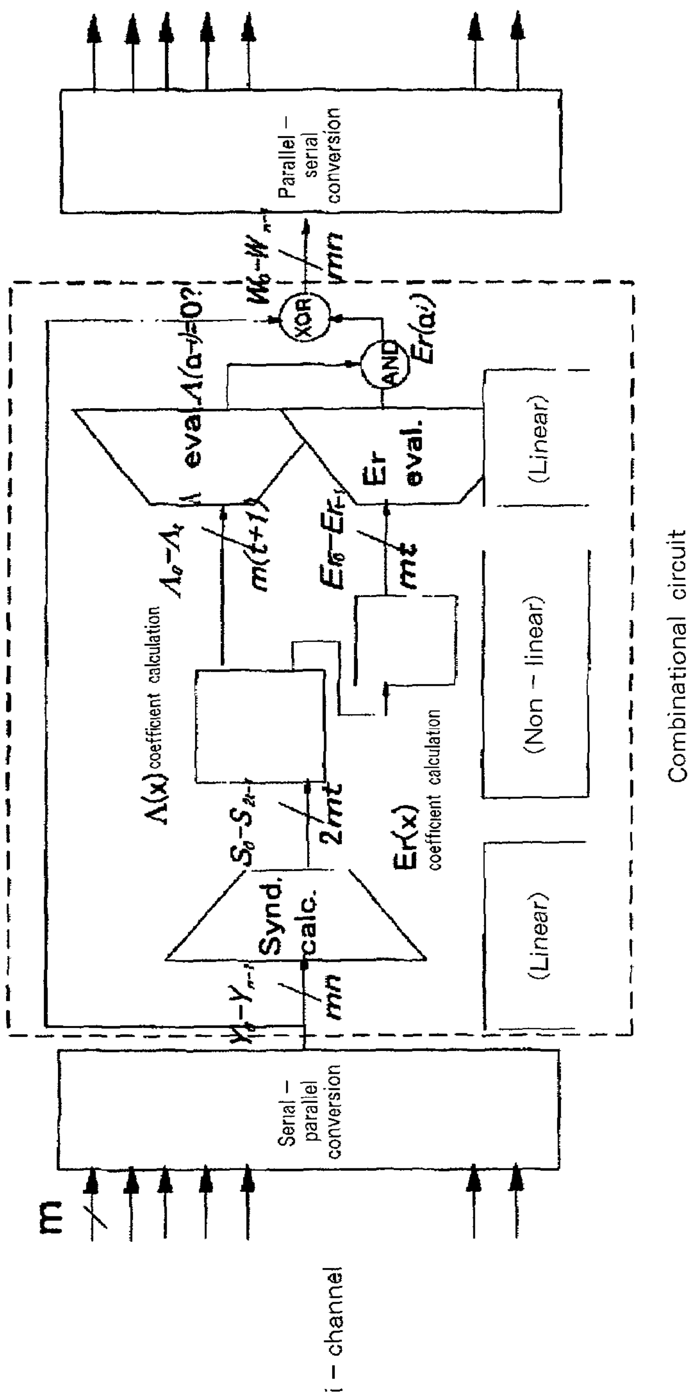
FIG. 5 is a diagram showing an additional conventional decoder.
Figure 6:
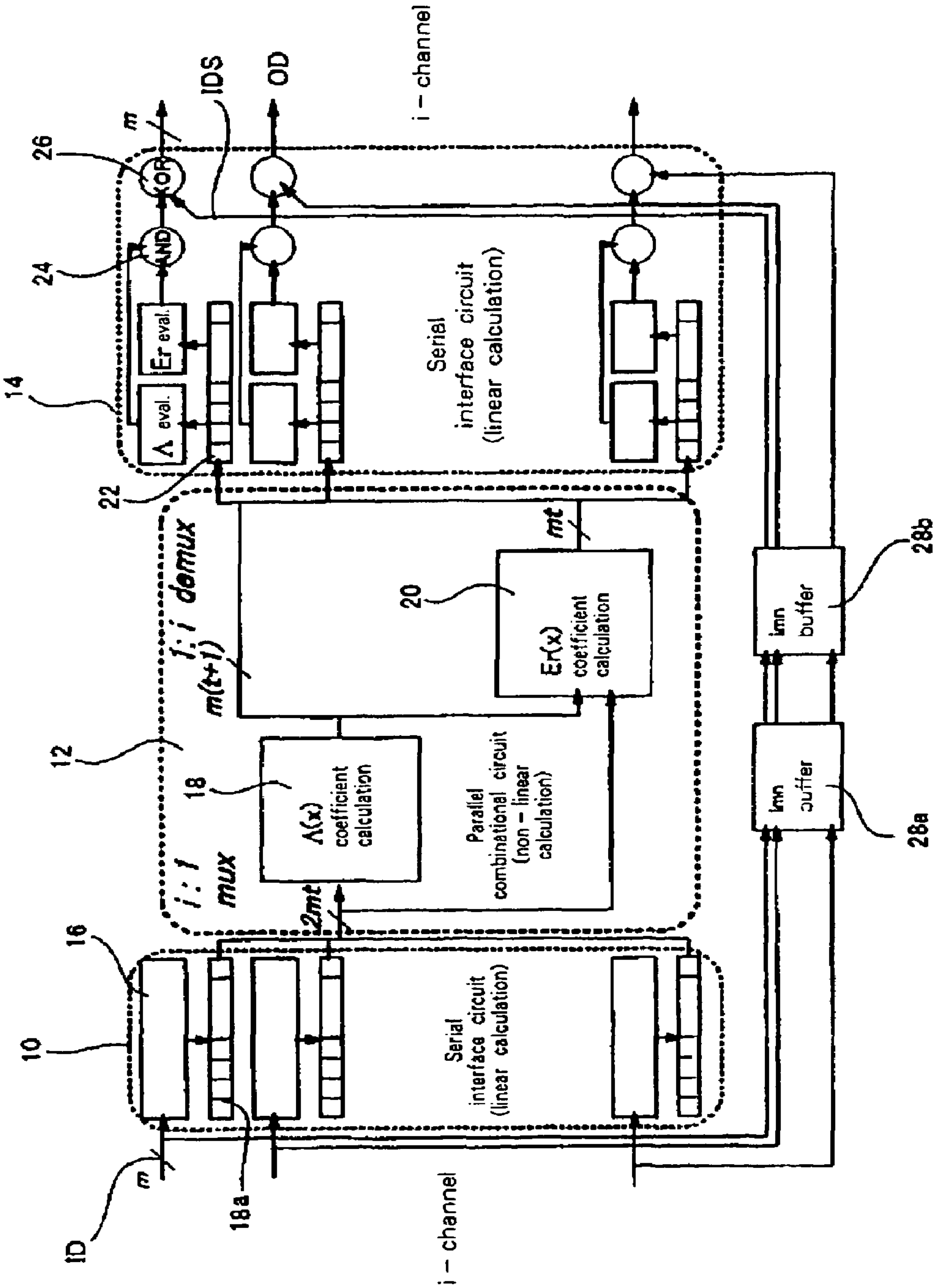
FIG. 6 is a schematic diagram showing a decoder according to one embodiment of the present invention.

FIG. 6 is a diagram showing a decoder according to the present invention that can be used to correct errors in digital signals received through optical communication. The decoder in FIG. 6 includes an input unit 10, a processor 12 and an output unit 14. The input unit 10 receives a 16-byte interleaved digital signal ID. The processor 12 processes a signal received from the input unit 10 and calculates coefficients of an error locator polynomial and coefficients of an error value polynomial. And the output unit 14 obtains an AND of the $\Lambda_{(x)}$ evaluation result and $E_{r(x)}$ evaluation result that are generated from the data received from the processor 12, performs an XOR process with the AND result and the input digital signal ID, and generates a digital signal OD. The digital signal OD is a signal in which errors that may have been included in the digital signal have been corrected.

In this invention, the digital signal ID input to the decoder in FIG. 6 can be one for which optical communication was used for its transmission, especially a signal transmitted by wavelength division multiplexing at a high data transfer rate of 40 Gbps. More specifically, the input digital signal ID can be, for example, a signal that is transmitted as (255, 239)RS code having a length of 2040 bits. Generally, for wavelength division multiplexing, by using the interleave method, the input digital signal is transmitted, for example, as a 16-byte parallel stream of 255 bytes to the decoding circuit of the invention.

In the decoder design in the invention in FIG. 6, input digital signals ID are interleaved and are input in parallel. A reception polynomial is defined for each input signal, and a syndrome Si is calculated using this polynomial and is output by the input unit 10. For (255, 239)RS code, the syndrome Si output by the input unit 10 (syndrome calculator) is generated as 16-byte digital information obtained from the 255 byte input digital signal. In the decoder for this embodiment in FIG. 6, the input digital signal of 2040 bits is interleaved, and the 16 255-byte serial streams that are obtained are transmitted to the input unit 10, while sixteen 16-byte syndromes corresponding to the 16 serial streams are generated by the input unit 10.

As is shown in FIG. 6, in the input unit 10, one syndrome calculator 16 is allocated for a serial stream IDS for each input digital signal ID, and calculates syndromes. The obtained syndromes for each serial stream IDS are stored in a register 18, and are output to the processor 12 one by one. For example, as is described above, 16 of 128 bit signals are obtained using the 16 interleaved 255 byte input digital signals in order to calculate error locations and error values. The syndrome calculator 16 that can be used for the input unit 10 in FIG. 6 can be any well known circuit, such as a circuit employing a sequential circuit. The method used for defining the syndromes and the calculation of the syndromes will be described later in detail.

In the decoder in FIG. 6, the obtained syndromes Si are sequentially transmitted to the processor 12. For convenience sake, for the explanation only one processor 12 is shown in FIG. 6. The processor 12 includes: an error locator polynomial calculator 18, which is a combinational circuit constituted by multiple multipliers and which is used to calculate an error locator polynomial Λ(x); and an error value polynomial calculator 20, which is used to calculate an error value polynomial Er(x). The combinational circuit that is used in the processor 12 and that includes multipliers will be described in more detail in Section 2 <Combinational circuit>.

The error locator polynomial Λ(x) and the error value polynomial Er(x), which are output by the processor 12 in FIG. 6, are demultiplexed by a demultiplexer (not shown) so as to, for example, correspond to the number of interleaves, and the results are transmitted to the output unit 14. The output unit 14 includes registers 22, and AND gates 24 and XOR gates 26, which are arranged in a number equivalent to the interleaves of input digital signals. The output unit 14 selects error values Er from the AND gates 24 by using the error location data $\Lambda_{eval}$ ("1" for an error location or "0" otherwise) that are obtained by the syndromes. The selected error values $E_r$ are added by the XOR gates 26, and each XOR gate receives, via buffers 28*a* and 28*b* of imn bits, a serial stream IDS obtained from the coded digital signal ID. When the subtraction of the Galois extension field $GF(2^m)$ is performed by the XOR gate 26, the 255 byte digital signal OD from which an error has been removed is output.

In the decoder in FIG. 6 for this invention, the combinational circuit constituting the processor 12 can be a sequential circuit. However, in this invention, especially, a plurality of multipliers may be constituted by three stages, an input side XOR calculator group (variable pre-processors), an AND calculator group and an output side XOR calculator group (residual calculators). When either one or both of the variable pre-processor and the residual calculator are used in common by multipliers, the size of the processor 12, which is the critical portion of the conventional calculation of error locations and error values, is practically allowable, and the processor 12 can be efficiently constituted by multipliers.

In the decoder of the invention in FIG. 6, the output unit 14 is constituted only by circuits, such as a constant multiplier and an adder, performing linear calculations, without a circuit being used to perform non-linear calculations that reduce the processing speed. Therefore, for this invention a decoding circuit having a small circuit configuration can be provided that performs a process without deteriorating the processing speed. Further, through the careful study to provide this invention, the present inventors found that a decoding circuit that is more flexible, faster and smaller than a conventional circuit could be constituted by using a combinational circuit that includes multipliers having a specific configuration, and an algorithm that permits the combinational circuit to efficiently calculate error locations and number of errors.

The method or the algorithm of the invention for the error locator polynomial calculation will, along with the combinational circuit, be described in detail later. An explanation will now be given for the function and the operation of the error value polynomial calculator 20 included in the processor 12 of the decoding circuit of the invention.

Selection of an Error Value Calculation Algorithm

According to the invention, an algorithm that can directly evaluate not only error locations but also error values through the calculation of the 0(t)-degree polynomial (linear calculation) is applied for the decoding of interleaved Reed-Solomon codes. At this time, in the algorithm used for this invention, the division necessary for an error value calculation is not performed for each error location on a critical path that is output following the evaluation of a polynomial, but by using only one calculation for each code word before the evaluation of a polynomial. Therefore, the values obtained by the polynomial evaluation can be directly output as error values at high speed at a constant cycle rate.

Further, it has been found that the degree of the error value polynomial Er(x) can be reduced to the t−1 degree that is the least required to obtain t independent outputs. At this time, t coefficients can be calculated by using the coefficients of the error locator polynomial and the syndromes. By using this algorithm, not only the syndrome calculation and the error location evaluation, but also the error value evaluation can be performed merely by a linear operating circuit. Thus, the entire input/output circuit can be simplified and the processing speed can be increased.

Various error value polynomials can be used for the decoding algorithm or the decoding method of the invention. In the explanation of the function and the operation of the invention, the following example is employed wherein when e errors have occurred at $i_o, \ldots$ and $i_{e-1}$ the error value polynomial Er(x) is provided as $$Er^{(e)}(\chi) = \sum_{l=0}^{e-1} \frac{E_{i_l} \prod_{j \neq l} (\chi + a^{i_j}) \prod_{j,k \neq l, j<k} (a^{i_j} + a^{i_k})}{\prod_{j<k} (a^{i_j} + a^{i_k})}$$

and where, while the division is included, the denominator is not a polynomial but is a constant for each code word (in the above equation, a denotes the primitive element of the Galois extension field).

The error value polynomial $Er^{(e)}(x)$ can not be used as it is for the decoding circuit in this invention, because the k-th error value $E_{i_k}$ (hereinafter referred to simply as $E_{i_k}$), which is present at location $a^{i_k}$ (hereinafter referred to simply as $a^{l_k}$), is required for the calculation of the polynomial $Er^{(e)}(x)$, and this makes no sense for the purpose of this invention. However, if all error values $E_{i_k}$ in $Er^{(e)}(x)$ and locations $a^{i_k}$ are written by the syndromes Si, this process can be provided as a circuit. Further, when all $a^{i_k}$ s in $Er^{(e)}(x)$ are described by the error polynomial $\Lambda_j^{(e)}$, the error value can be calculated before the error locations are acquired. Therefore, the calculation of error values can be performed in parallel, and as a result, the processing speed can be increased.

The above process can be performed by using the following decoding algorithm or decoding method. First, the denominator is written by $\Lambda_j^{(e)}$. The coefficients of the error value and error locator polynomials are elementary symmetric functions for error locations $$a^{i_0}, a^{i_1}, a^{i_2}, \ldots, a^{i_{t-1}}$$

excluding a constant factor. For example, for coefficients of the error locator polynomial, $\Lambda_1, \Lambda_2, \ldots, \Lambda_t$, the following equations are established:

$$\Lambda_1 = \sum_k a^{i_k}$$

$$\Lambda_2 = \sum_{k<l} a^{i_k} a^{i_l}$$

$$\vdots$$

$$\Lambda_{t-1} = a^{i_0} a^{i_1} a^{i_2} \cdots a^{i_{t-1}}.$$

The error locations $a^{l_0}, a^{i_1}, a^{i_2}, \ldots, a^{i_{t-1}}$ can be exchanged with each other. Further, the following new relation $$f^{(e)} = \prod_{m>l} (a^{i_m} + a^{i_l})$$

$$= \begin{vmatrix} \Lambda_1^{(e)} & \Lambda_3^{(e)} & \cdots & 0 & \cdots & 0 \\ 1 & \Lambda_2^{(e)} & \Lambda_4^{(e)} & \cdots & 0 & \cdots 0 \\ 0 & \Lambda_1^{(e)} & \Lambda_3^{(e)} & \cdots & 0 & \cdots 0 \\ \vdots & & \ddots & & & \vdots \\ 0 & \cdots & 0 & \cdots & \Lambda_{e-2}^{(e)} & \Lambda_e^{(e)} \\ 0 & \cdots & 0 & \cdots & \Lambda_{e-3}^{(e)} & \Lambda_{e-1}^{(e)} \end{vmatrix}$$

can be obtained by a relation (e.g., see "Symmetric Functions and Orthogonal Polynomials", I. G. Macdonald, American Mathematical Society, 1998) that is established between the Elementary symmetric function and the Shur function defined by the division of two Vandermonde matrixes, and the exchange relation, $(a+b)^2=(a-b)^2=a^2+b^2$, that is established between the addition and the square performed for the Galois extension field $GF(2^m)$.

When the above determinant is employed, the denominator of $Er^{(e)}(x)$ can be written by $\Lambda_i^{(e)}$. When the numerator of $Er^{(e)}(x)$ is calculated in the same manner, as is indicated by the following equation, the coefficients of $Er^{(e)}(x)$ can be written merely by Si and $\Lambda_i^{(e)}$, and can be calculated without using $E_{l_k}$ and $a^{i_k}$.

$$Er^{(e)}(\chi) = \frac{\sum_{k=0}^{e-1} E_{i_k} \prod_{j\neq k}(\chi + a^{i_i}) \prod_{m,l\neq k,m>l}(a^{i_m} + a^{i_l})}{\prod_{m>1}(a^{i_m} + a^{i_i})}$$

$$= \frac{\sum_{k=0}^{e-1} E_{i_k}\left(\sum_{j=0}^{e-1} \chi^j \Lambda^{(e)}_{e-j-1_{i_k}}\right) f^{(e-1)}\left(\Lambda^{(e)}_{1i_k}, \Lambda^{(e)}_{2i_k}, \ldots, \Lambda^{(e)}_{e-1i_k}\right)}{f^{(e)}(\Lambda^{(e)}_1, \Lambda^{(e)}_2, \ldots, \Lambda^{(e)}_e)}$$

$$= \frac{\sum_{k,j,m=0}^{e-1} E_{i_k} a^{i_k m} \chi^j Er^{(e)}_{jm}(\Lambda^{(e)}_1, \Lambda^{(e)}_2, \ldots, \Lambda^{(e)}_e)}{f^{(e)}(\Lambda^{(e)}_1, \Lambda^{(e)}_2, \ldots, \Lambda^{(e)}_e)}$$

$$= \frac{\sum_{j,m=0}^{e-1} S_m \chi^j Er^{(e)}_{jm}(\Lambda^{(e)}_1, \Lambda^{(e)}_2, \ldots, \Lambda^{(e)}_e)}{f^{(e)}(\Lambda^{(e)}_1, \Lambda^{(e)}_2, \ldots, \Lambda^{(e)}_e)}$$

where $\Lambda_{ji_k}{}^{(e)}=\Lambda_j{}^{(e)}a^{l_k}\Lambda_{j\text{-}li_k}{}^{(e)}$. Specifically, this coefficient, is that of the error locator polynomial that corresponds to the error location except $a^{lk}$.

As is described above, when these new relations are employed, the output unit 14 can be constituted by a linear operating circuit for the Galois extension field $GF(2^m)$, without a non-linear operating circuit being required, and the processing speed can be increased.

The following configuration is employed to constitute a fast, small coding circuit that can also cope with interleaved codes based on the above error value calculation algorithm.

(1) Use of Fast Input Unit and Output Unit (Linear Operating Circuit)

First, in consideration of the structure of the code (the number of interleaves), the bus width of an input/output interface and the number of clocks, a polynomial evaluation (linear operating) circuit, which is connected to the input side to calculate syndromes, and a polynomial evaluation (linear operating) circuit, which is connected to the output side to evaluate error locations and error values, are implemented as fast sequential circuits that employ a cyclic structure that comes from the fact that RS codes are cyclic codes, and that perform a pre-process and a post-process for (n, k) Reed-Solomon code at an arbitrary number of clocks from 1 to n. Especially effective for the invention is the fact that the above described structure is also employed for an error value evaluation portion that is a critical path for the conventional method. According to the structure of the invention, a decoding circuit can be provided as an interface that can flexibly cope not only with an input digital signal that has 255 bytes for each code word, but also with ones that have 1, 3, 5, 15, 17, 51 and 85 bytes.

Table 1 shows the relation between the width of a digital signal input to the decoding circuit and the processing clock required for this input width.

TABLE 1

The input/output width and a clock count for each code word (n = 255)

| | | | | | | | | |
|---|---|---|---|---|---|---|---|---|
| Input/output width (bytes) | 1 | 3 | 5 | 15 | 17 | 51 | 85 | 255 |
| Clock count required for processing a code word (n = 255) | 255 | 85 | 51 | 17 | 15 | 5 | 3 | 1 |

As is shown in Table 1, although the required number of clocks is increased as the width of the input digital signal is reduced, the decoder of the invention can flexibly cope with it.

In addition, in this invention, an arbitrary input/output byte width other than those in Table 1 can be selected for each code word. For example, an input/output width of eight bytes can be coped with when the code length is n=256 bytes by adding a one byte dummy at the end.

(2) Connection to a Non-Linear Operating Circuit 12

In this invention, a plurality of input units 10 and output units 14 that are constituted by sequential circuits are prepared in a number equivalent to the interleaves. Between these units, the non-linear operating circuit 12 is connected that calculates the coefficients of an error locator and error value polynomials by a multiplexer, a demultiplexer and a circuit for holding the syndromes and the coefficients of an error locator and error value polynomials. As is described above, this operating circuit 12 is constituted as a combinational circuit for a non-linear operating circuit, such as a multiplier that performs non-linear calculation. Therefore, in this invention, in the case where ITU-T G.709 (255, 239) Reed-Solomon code is obtained by 16-byte interleaving, 16 sequential circuits must be prepared before and after the operating circuit 12. In other words, in this case, multiplexing and demultiplexing must be performed at a ratio of 16:1. However, in this invention, in order to multiplex and demultiplex the coefficients of the syndrome polynomial, only a signal of 128 bits (or 136 bits at the succeeding state, depending on how $\Lambda(x)$ is defined) need be processed instead of 2040 bits, so that the required numbers of multiplexers, demultiplexers and buffers can be greatly reduced.

(3) Three-Stage Pipeline Operation System That Employs the Non-Linear Operating Circuit in the Center in a Time Sharing Manner According to the present invention, the entire decoder is operated as a three-stage pipeline formed from a linear operating circuit (syndrome calculation), a non-linear operating circuit (calculation of coefficients for error locator and error value polynomials) and a linear operating circuit (evaluation of error locations and error values), and the non-linear operating circuit of a low latency is employed in a time sharing manner by serially providing syndromes for code words for the calculation of interleaved code. Therefore, it is possible to provide efficient decoding of interleaved codes whose processing capability per circuit size is high. In the OC-768 case, for example, in order to operate the three-stage pipeline, the non-linear operating circuit in the center must complete the process for each interleaved code word at a latency of about 40 ns. When the combinational circuit is implemented by the most advanced semiconductor technique (0.18 μm or better), the above decoder can be provided as an ASIC semiconductor device.

More specifically, in the invention, fast decoder and error correction devices, the sizes of which fall within an acceptable range, can be provided by synergistic effects obtained by: (1) the use of a fast input unit 10 and a fast output unit 14, especially the use of only a linear operating circuit when calculating error locations and error values, the application of the above described algorithm for the processor 12, and the use of a configuration for a multiplier that can reduce the circuit size, and (2) the employment of the three-stage pipeline operation system by, in a time sharing manner, the processor 12, which essentially performs a non-linear calculation. In section 2, which follows, an explanation will be given for a combinational circuit that comprises multipliers included in the processor 12 of the decoder of the invention.

Section 2 Combinational Circuit

The processor 12 used for the decoder of the invention is a nonlinear circuit, specifically, a combinational circuit that uses multipliers. Unlike multipliers used for a conventional combinational circuit that has two stages, consisting of an AND calculator group and an XOR calculator group, in order to perform the multiplication of the Galois extension field $GF(2^m)$, the multiplier used for this invention has three stages, consisting of XOR gates, AND gates and XOR gates.

Configuration of a Single Parallel-Multiplier

While many studies have been made of a single multiplier, a parallel multiplier (Mastrovito Multiplier), which is constituted as a combinational circuit, not as a sequential circuit, is a field of active research. For a conventional parallel multiplication circuit (hereinafter, in this specification, referred to simply as a multiplier), there are two configuration types: the AND-XOR type and the XOR-AND-XOR type, which can be converted into each other. It should be noted, however, that the AND-XOR type is generally employed when a circuit is provided for only a single multiplication. This is because while the AND-XOR type has been well studied and various methods for obtaining a small circuit have been proposed, there is no guarantee that the circuit size for the XOR-AND-XOR type will be reduced (or may be increased), and the reduction effects can not be obtained that would compensate for the expenditure of the effort a complicated design operation would entail. The AND-XOR type and the XOR-AND-XOR type will be further described.

(1) AND-XOR Type

This is a typical method used for performing calculations in the same manner as are calculations performed with figures written down on paper, and generally a circuit of this type is employed. Specifically, the coefficients of two (m−1) th degree polynomials, which are multiplication arguments, are combined to prepare $m^2$ partial products. This is the processing performed by the AND section. Then, partial products that have the same degree are added together to form a (2m−2)th degree polynomial, and a residue operation using an irreducible polynomial is performed to obtain the (m−1)th degree solution. This is the processing performed by the XOR section. The number of ANDs is $m^2$ and the number of XORs is $O(m^3)$, and it is widely known that $(m^2-1)$ XORs can be obtained by selecting an appropriate irreducible polynomial and basis. An arbitrary multiplier can always be constituted by this method.

(2) XOR-AND-XOR Type

Generally, according to the Boolean algebra rule (A and B) xor (A and C)=A and (B xor C), it is possible for the XOR calculation in the residue operation unit of the AND-XOR circuit to be moved in front of the AND for use as a variable pre-processor (input side XOR calculator). Thus, the XOR-AND-XOR multiplication circuit can be obtained. For moving the XOR calculation, when an even number of the same redundant terms are added to the XOR of the residue operation unit (output side XOR calculator) by the properties A xor A=0 and B xor 0=B, many XOR calculations may be moved to the front-end as a pre-processor. Since this operation can be employed, various methods for moving the XOR are available, in addition to the simple application of the distributive law. Therefore, multiple AND-XOR types are present even with the same basis or irreducible polynomial. The number of gates in the XOR-AND-XOR type can vary, and may become either greater or smaller than that in the AND-XOR type. Another method is known whereby the number of XOR gates is systematically reduced by choosing a special basis, such as the Composite Field Multiplier that will be described below.

(3) A Method for Constructing an XOR-AND-XOR Type that can be Applied Only for a Limited Field (Composite Field Multiplier)

The composite field multiplier is a multiplier construction method that can be used only in a special case, such as where m is a composite number and the basis used for the representation of an element in a field may not be an ordinary basis (such as polynomial basis or normal basis). This method will now be described in detail. When m is a composite number, extension field $GF(2^m)$ can be constructed by two fold extensions of the field GF(2). The composite field multiplier method is a method for constructing, in accordance with the extension process, a multiplier having a recursive structure. At this time, when the product of the two values Ax+B and CX+D in $GF(2^m)$ (A, B, C and D are values in the sub-field $GF(2^{m/2})$)

$$(Ax+B)(Cx+D)=ACx^2+(((A+B)(C+D)+AC+BD)x+BD)$$

is employed for one quadratic extension, the number of multiplications performed in the sub-field can be reduced from four to three, and the circuit size can be reduced (KOA). At the same time, the circuit can be provided as an XOR-AND-XOR structure (the addition performed before the multiplication corresponds to the XORs arranged in front of AND). It should be noted that the use of KOA is premised on the use of the composite field multiplier, otherwise, KOA can not be used. If the value of m is the composite number for which this method can be applied, a field converter is required, and the circuit size is increased because of the overhead. Thus, when a circuit is to be prepared for only a single multiplication operation, the circuit structure does not generally, employ the composite field multiplier.

Figure 7:
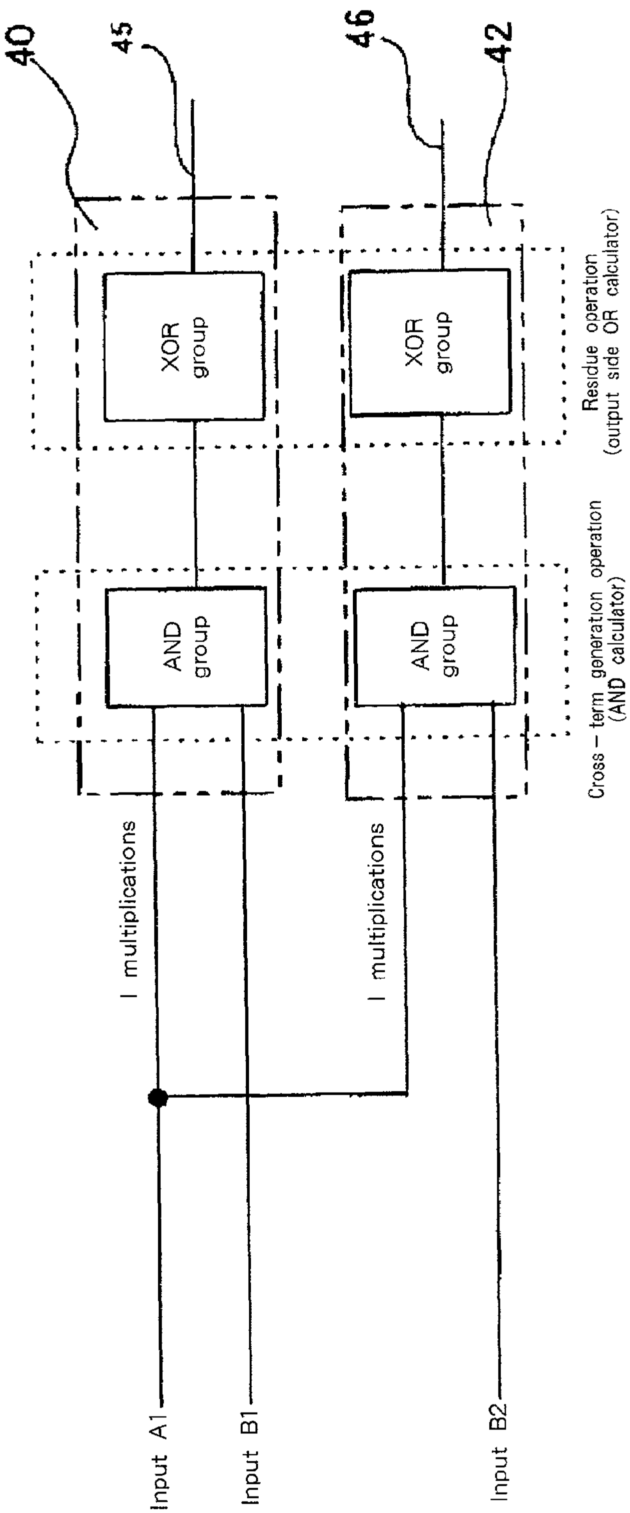
FIG. 7 is a diagram showing a multiplier having a conventional configuration.
Figure 8:
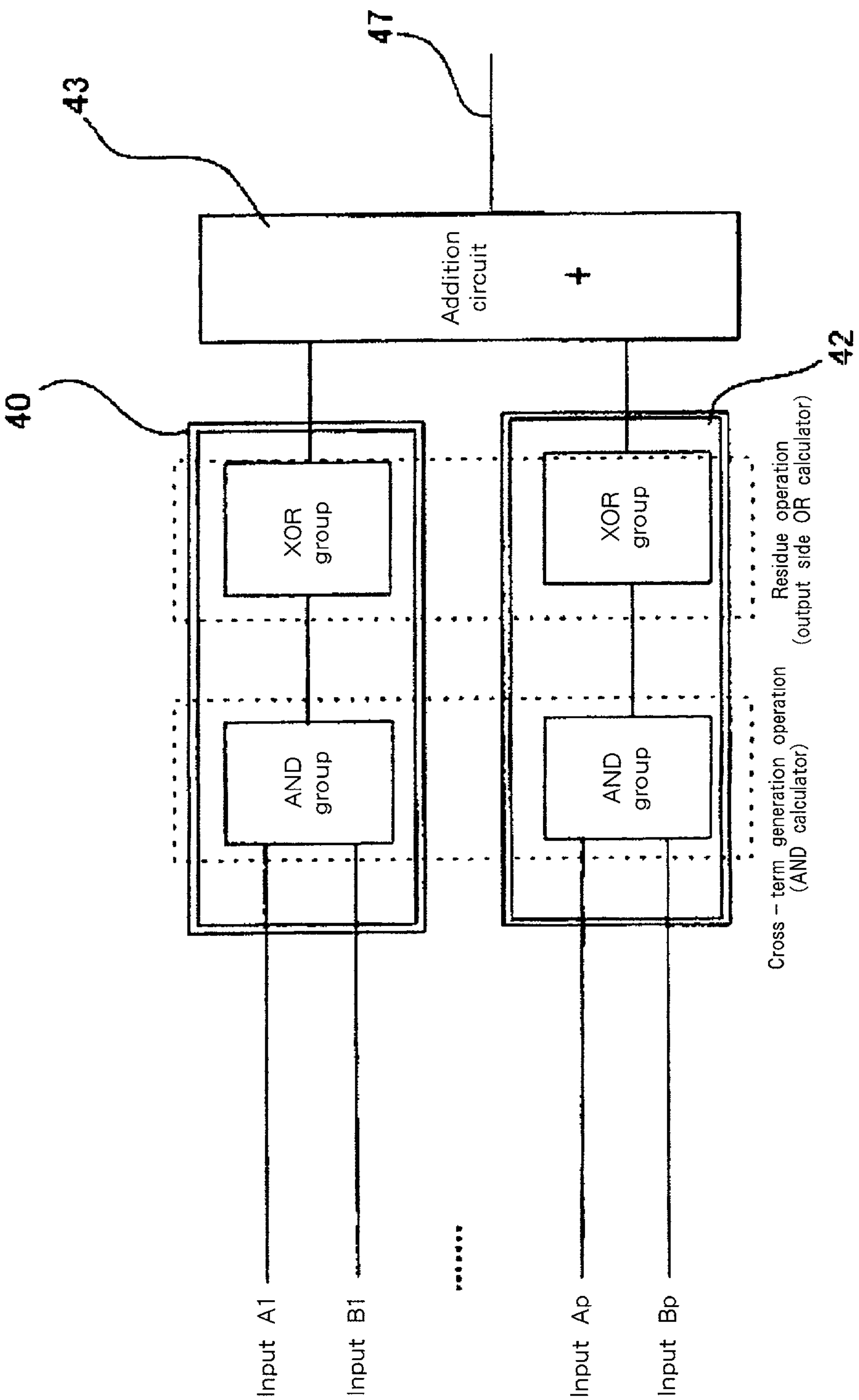
FIG. 8 is a diagram showing a multiplier having another conventional configuration.

Configuration of a Combinational Circuit According to the Invention Using Ordinary Multipliers FIGS. 7 and 8 are diagrams showing a configuration wherein multipliers with common input and a logical sum calculation circuit for the invention are constituted by a common AND-XOR type. In the example in FIG. 7, a combinational circuit using two multipliers is shown. As is shown in FIG. 7, a first input A1 is transmitted to both a multiplier 40 and a multiplier 42, while a second input B1 is transmitted o the multiplier 40 to obtain a first output 45, and a third input B2 is transmitted to the multiplier 42 to obtain a second output 46. In the conventional structure in FIG. 7, even though the multipliers receive common input, no circuit exists that these multipliers can employ in common. In the example in FIG. 8, the conventional multiplier structure is employed for a combinational circuit that performs logical sum calculations. It is again apparent that in FIG. 8 no circuit exists that the multipliers can use in common when performing logical sum calculations.

Figure 9:
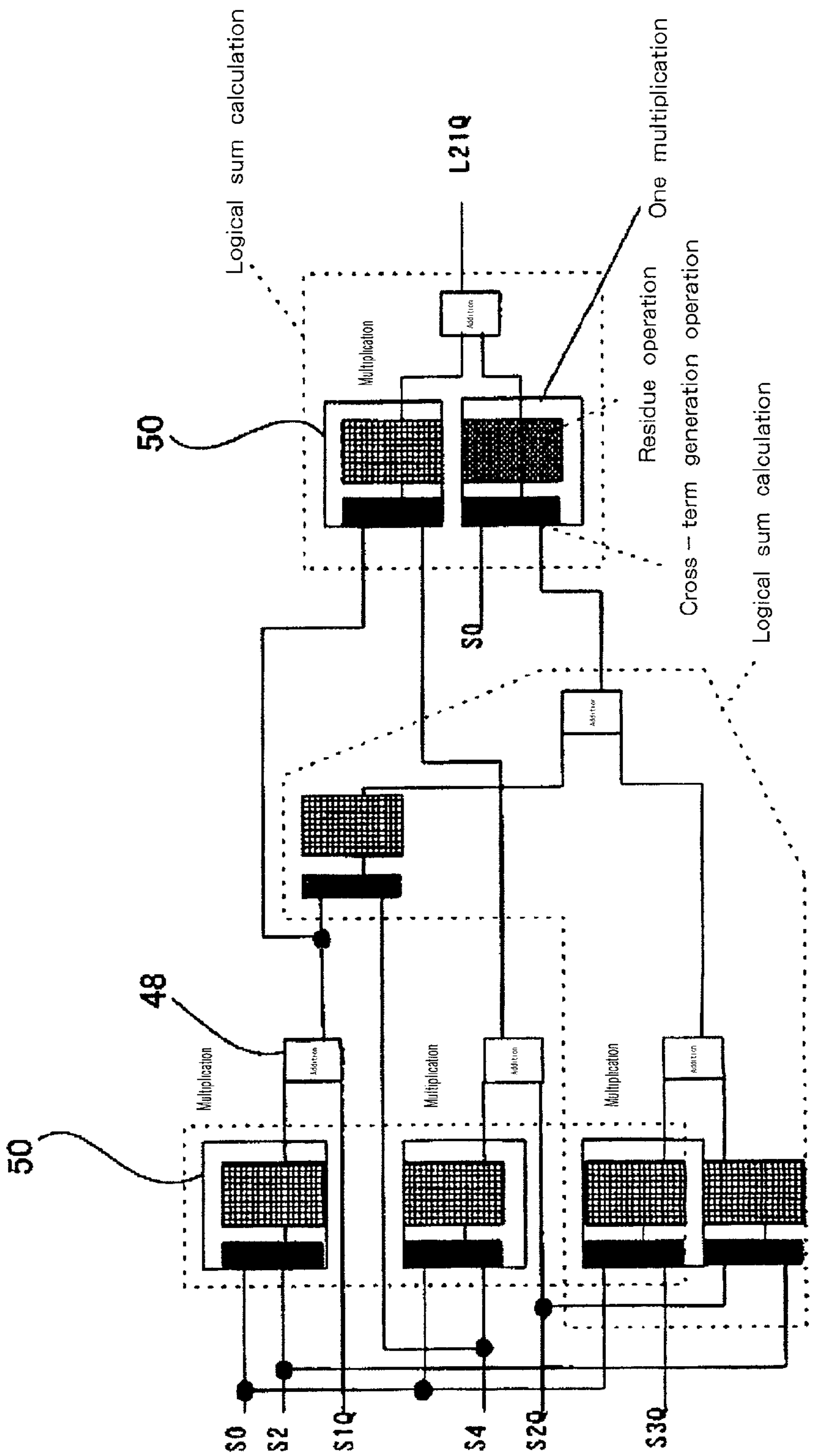
FIG. 9 is a diagram showing a multiplier having an additional conventional configuration.

FIG. 9 is a diagram showing a combinational circuit employing conventional multipliers. In FIG. 9, one symbol is represented by one line, and 8-bit width input and output are assumed. The combinational circuit in FIG. 9 includes six-symbol input and one-symbol output, and seven multiplication circuits and five addition circuits. In the combinational circuit in FIG. 9, inputs S0, . . . and S3Q are transmitted to multipliers 46 and are added together by adders 48. The results are then transmitted to a logical sum calculation circuit 50 whereat an output L21Q, the logical sum of the inputs, is generated.

In FIG. 9, a combination of cross-term generation operation and residue operation, indicated by broken lines, corresponds to one multiplication. Since a standard circuit structure is used for the multipliers shown in FIG. 9, no detailed explanation will be given for the circuit. The combinational circuit, including the multiplication circuit, includes 64 AND gates and about 103 XOR gates, and for the entire circuit, the number of gates is 448 ANDs+about 761 XORs. As is apparent from FIG. 9, for almost all the multipliers, one or both inputs are used in common by another multiplier. Further, the logical sum calculation is performed at the final stage.

Table 2 shows the numbers of gates that are included in multiplication circuits for a Galois extension field $GF(2^8)$. They are conventional multiplier which has two-stage AND-XOR structure, a composite field multiplier, and a multiplication circuit, for which XOR-AND-XOR is employed for the multiplication of a sub-extension field $GF(2^4)$.

TABLE 2

| | Variable pre-process | Cross-term generation | Residue operation |
|---|---|---|---|
| Standard AND-XOR multiplication circuit | None | +64AND | +103XOR |
| Composite Field Multiplier | 4XOR*2 | +48AND | +56XOR |
| XOR-AND-XOR circuit for performing the multiplication of sub-extension field $GF(2^4)$ to obtain the effects of the invention | | | |
| a. Alteration of all three multiplications of a sub-field | 22XOR*2 | +30AND | +44XOR |
| b. Alteration of two out of three multiplications | 16XOR*2 | +36AND | +48XOR |
| c. Alteration of one of three multiplications | 10XOR*2 | +42AND | +52XOR |

AS can be seen from Table 2, as far as only a single multiplier is concerned, the circuit sizes for cases a. to c. are increased when compared with the size of the conventional composite field multiplier, and are not the minimum size. As is described above, when the three-stage XOR-AND-XOR structure is simply employed for a single multiplier, in some cases the circuit size may be increased.

Multiplier Structure for a Combinational Circuit According to the Invention

Generally, optimization of Boolean algebra is difficult when many multiplications and logical sum calculations are performed together. However, in consideration of the use of the combinational circuit as the processor 12 for the invention, many logical sum calculators and many multipliers are connected in parallel at multiple stages. The i-th logical sum calculator generally receives 0-th to (i−1)th outputs. Therefore, since the backend part of the operation circuit must process in parallel inputs used in common by almost the entire combinational circuit, the optimization range is extended. The present inventors focused on this point, and achieved an efficient configuration for a multiplier by performing the optimization for Boolean algebra, while taking into account the balance obtained with other operations.

Figure 10:
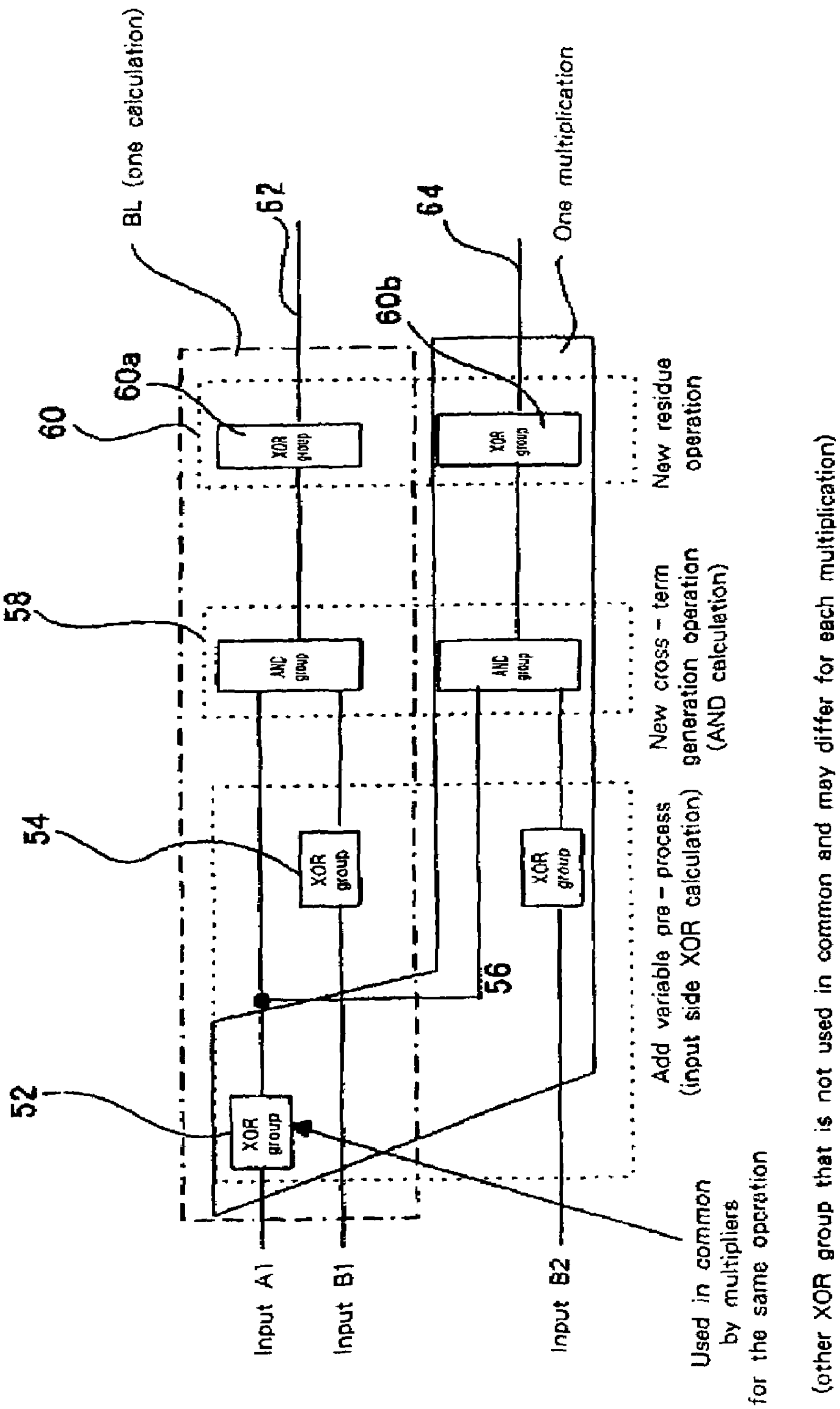
FIG. 10 is a diagram showing the embodiment wherein the present invention is applied for the multiplier in FIG. 7.

FIG. 10 is a diagram showing a combinational circuit according to the embodiment wherein a three-stage structure is employed for the multiplier in the combinational circuit in FIG. 7, which includes conventional multipliers and adders. In the combinational circuit in FIG. 10, an input A1 is transmitted to a first XOR group 52, an input B1 is transmitted to a second XOR group 54, and an input B2 is transmitted to a third XOR group 56. These XOR groups 52, 54 and 56 are gates used by this invention to perform the variable pre-process. Since the XOR groups 52 process the common input A1, the circuit size is reduced. The outputs of the XOR groups 52, 54 and 56 are transmitted to AND groups 58, and when a cross-term is obtained, the residue operation is performed again by downstream XOR groups 60, an output 62 being generated by an XOR group 60*a*, and an output 64 being generated by an XOR group 60*b*. In FIG. 10, the unit for performing one multiplication is indicated by broken line BL, and three stages, a variable pre-processor (XOR)—a cross-term operation unit (AND)—a residue operation (XOR), constitute one multiplier. As is shown in FIG. 10, when the XOR-AND-XOR structure is employed for each multiplier, and when for the multipliers the XOR calculations to be performed for an input used in common is unified, the XOR calculation circuits can be shared by the multipliers. So long as the size of a portion (variable pre-processors*2+new cross-term generation+new residue operation unit) that corresponds to one multiplier is the same or slightly larger than the normal multiplication circuit, the size of the entire multiplier group can be reduced.

Figure 11:
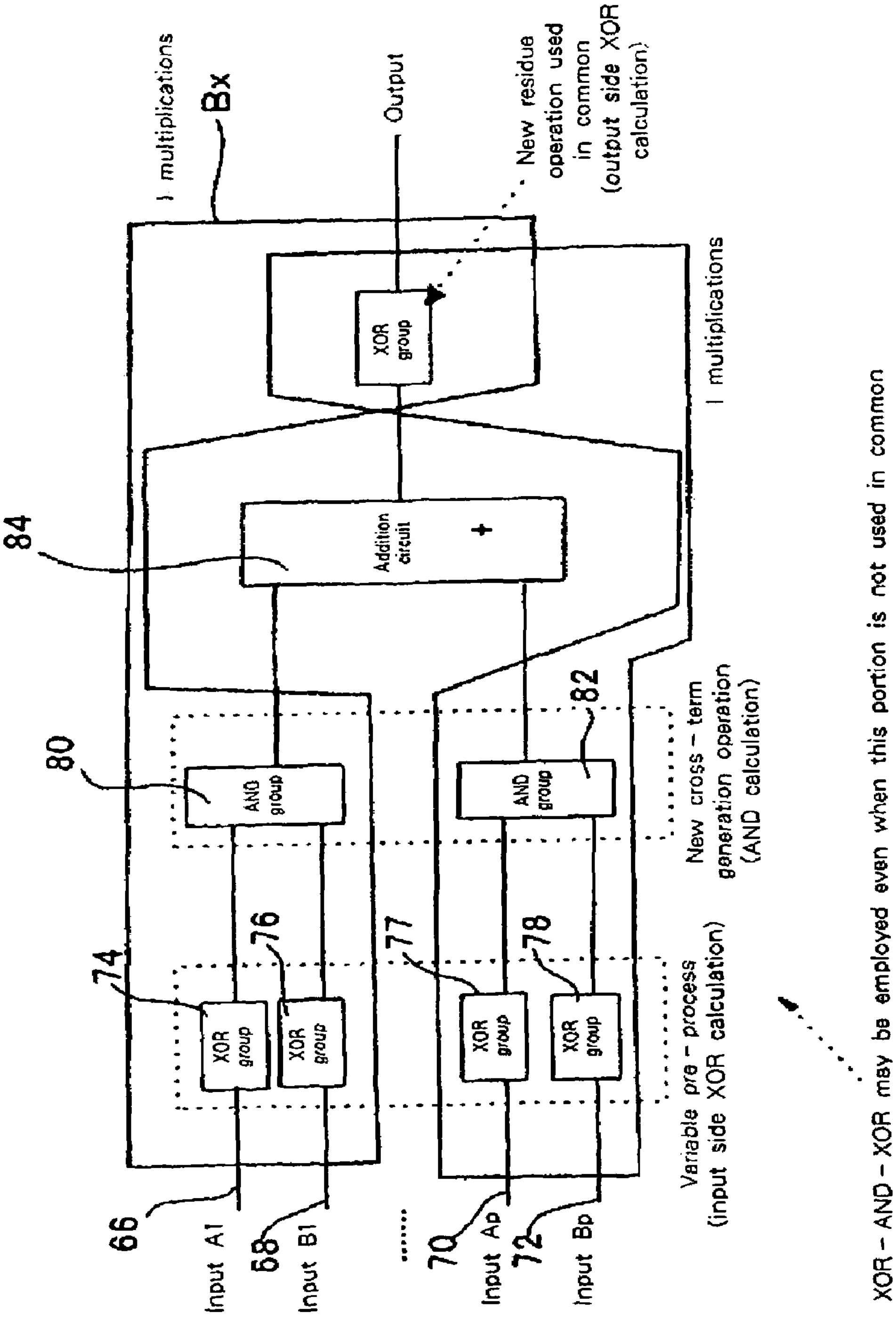
FIG. 11 is a diagram showing the embodiment wherein the present invention is applied for the multiplier in FIG. 8.

FIG. 11 is a diagram showing a combinational circuit according to another embodiment wherein a three-stage multiplier used for the invention is mounted for the conventional combinational circuit in FIG. 10. In the combinational circuit in FIG. 11, inputs 66, 68, 70 and 72 are transmitted to XOR groups 74, 76, 77 and 78 that perform the variable pre-process, and the outputs of the individual XOR groups are transmitted to AND groups 80 and 82 that perform the cross-term generation operation.

The outputs of the AND groups 80 and 82 are transmitted to an addition circuit 84 and are added together, and the residue operation and the multiplication are again performed by a backend XOR group 86 that is used in common, so that an output 88 is generated. The structure of one multiplier in FIG. 11 is formed in a block Bx. The difference from the structure in FIG. 10 is that, in the invention, even when the XOR groups 74, 76, 77 and 78 on the input side are not shared the backend or output side XOR group 86 that performs the residue operation is used in common.

Further, in the invention, when the XOR groups 74 to 78 on the input side, which perform the variable pre-process, are used in common, and the XOR groups that perform the residue operation are also used in common, the overall structure of the combinational circuit can be simplified.

Figure 12:
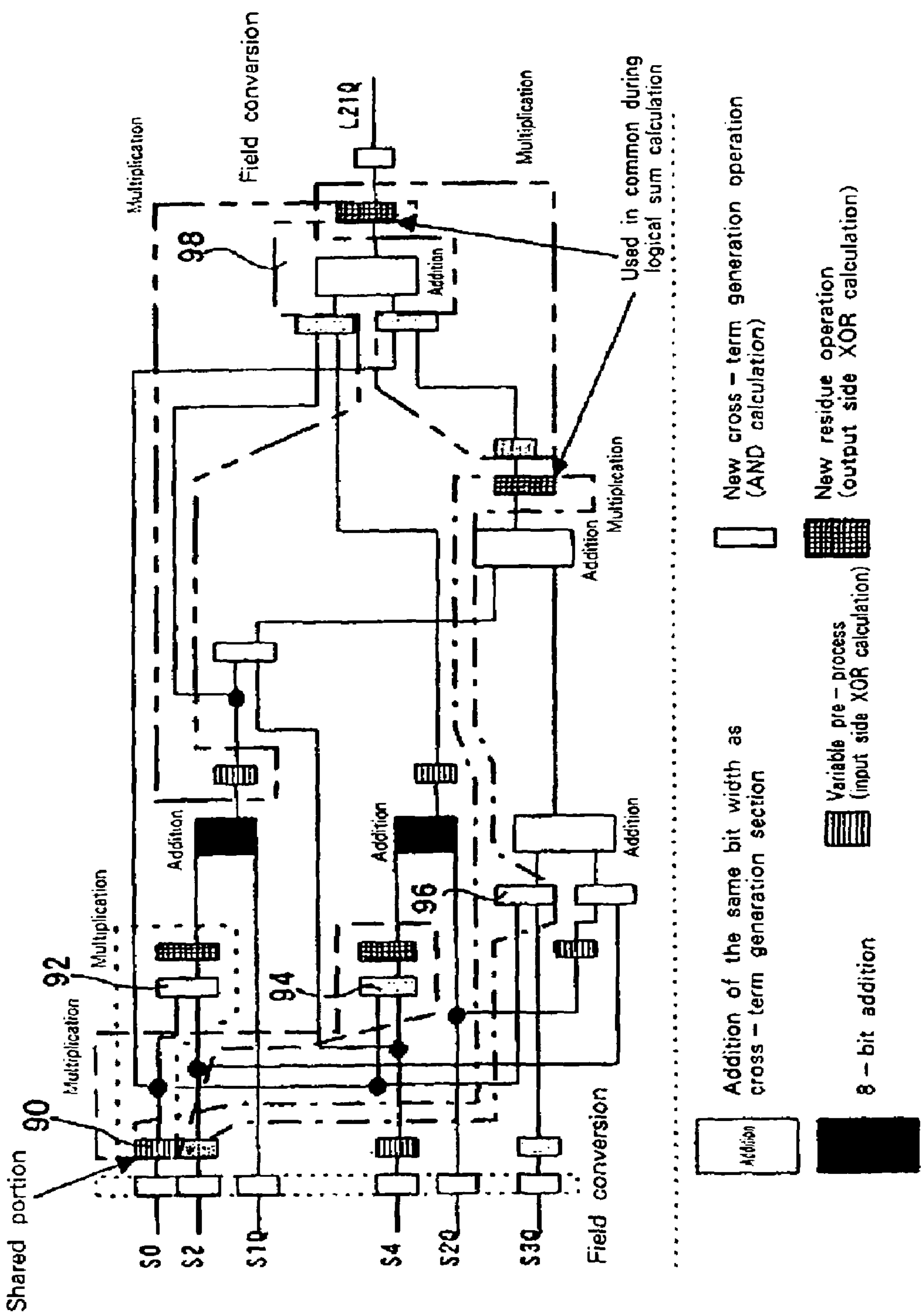
FIG. 12 is a diagram showing the embodiment wherein the present invention is applied for the multiplier in FIG. 9.

FIG. 12 is a diagram showing a combinational circuit according to an additional embodiment wherein a three-stage structure is employed for the multiplier in the combinational circuit in FIG. 9. The combinational circuit in FIG. 12 constitutes a part of the processor 12 in the decoder (e=2) in FIG. 6 for error correction by RS codes. The combinational circuit in FIG. 12, as does the conventional example in FIG. 9, receives input S0 to S3Q, and as is shown in the blocks in FIG. 12, an XOR gate 90 that performs the variable pre-process for input S0 is used in common by three multipliers that correspond to AND gates 92, 94 and 96. A residue operation unit 98 is shared by a plurality of multipliers, and both an XOR gate used for the variable pre-process and an XOR gate used for the residue operation are used in common. One multiplier is indicated by a chained line. In the combinational circuit in FIG. 12, eight variable pre-processors, seven cross-term generation operation units, four residue operation units, two 8-bit adders, and three adders having the same bit width as the cross-term generation operation unit are provided.

Therefore, when, based on the multiplication circuits in Table 2, a part of the decoder is to be constituted by the combinational circuit in FIG. 12, the number of gates required can be determined as shown in Table 3.

TABLE 3

| | |
|---|---|
| Composite Field Multiplier<br>Present invention | 416XOR + 336AND Total 752gate |
| a. Alteration of multiplication for all three sub-fields | 458XOR + 210AND Total 668gate |
| b. Alteration of multiplication for two of the three sub-fields | 444XOR + 252AND Total 696gate |
| c. Alteration of multiplication for one of the three sub-fields | 430XOR + 294AND Total 724gate |

It is apparent from a. to c. in Table 3, that even if the single multiplier is not intentionally minimized, the overall size of the circuit can be reduced.

Figure 13:
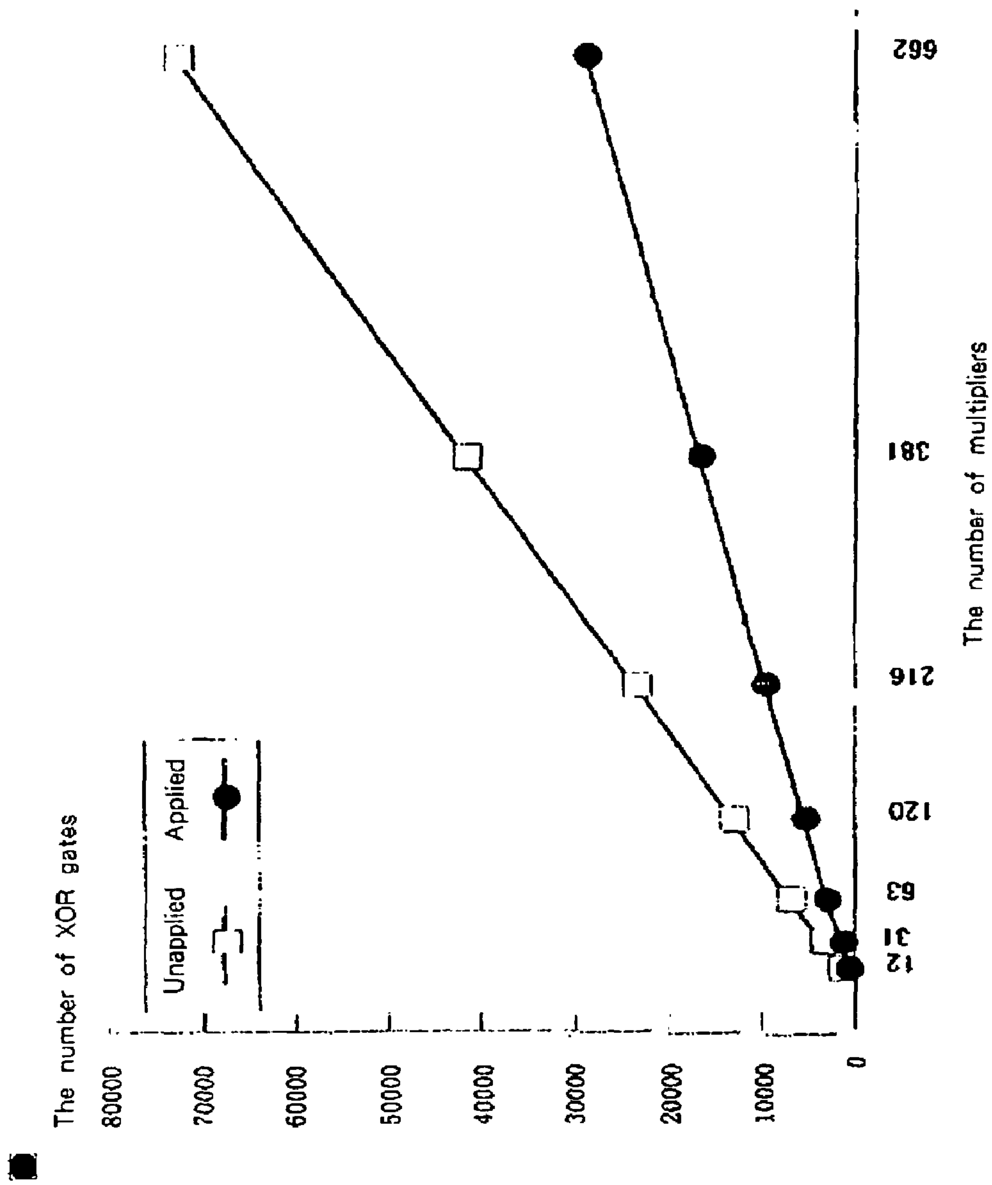
FIG. 13 is a graph obtained by plotting the circuit size and the number of multiplier when the multiplier according to the invention is employed.

FIG. 13 is a graph showing the number of XOR gates and the number of corresponding multipliers that are required for use for the processor 12 in the error correction circuit having the error correction capability t=2 to 8 in FIG. 6. In FIG. 13, the vertical axis represents the total number of XORs, and the horizontal axis represents the number of multipliers. In this case, for the decoder for error correction in FIG. 6, m=8 and the irreducible polynomial is $x^8+x^4+x^3+x^2+1$. In this case, 662 multiplications, 531 additions and 30 square calculations are performed. As is apparent from Table 3 and FIG. 13, even if the single multiplier is not intentionally minimized, by the configuration of the invention, a greater reduction can be obtained in the overall size of the combinational circuit.

In the embodiment in FIG. 13, the same variable pre-processor, cross-term generation operation unit and residue operation unit were used for all the multiplications in order to clearly present a specific circuit structure. In order to obtain better results when these circuits are actually implemented, the number of XORs in the arrangements for the variable pre-processor and the residue operation unit (i.e., which of a. to c. is to be employed) can be changed and optimized for each multiplication operation performed by the circuit. Further, in the embodiment in FIG. 13, since the ratio of the number of operations to the number of inputs is small and an overhead for field conversion is also present, no very great effect is obtained by reducing the number of gates. However, in actuality, since as is shown in FIG. 14 the ratio of the operations to the input is quite high, because of the effects produced by a reduction in the number of gates the circuit size can be dramatically reduced.

Section 3 Error Correction Algorithm

A detailed explanation will now be given for an error correction algorithm that is used by the decoding circuit and the error correction device of the invention.

Overview of the Conventional Example

A. Conventional Method for Solving the Yule-Walker Equation or for Obtaining an Error Locator Polynomial, and a Problem Associated With These Methods According to the invention, it is necessary to find an efficient algorithm for a combinational circuit to calculate the following simultaneous linear equation, which is defined over $GF(2^m)$, $$\begin{pmatrix} S_0 & S_1 & \cdots & S_{l-1} \\ S_1 & S_2 & \cdots & S_l \\ \vdots & & \ddots & \vdots \\ S_{l-1} & S_l & \cdots & S_{2l-2} \end{pmatrix} \begin{pmatrix} \Lambda_l^{(l)} \\ \vdots \\ \vdots \\ \Lambda_l^{(l)} \end{pmatrix} = \begin{pmatrix} S_l \\ \vdots \\ \vdots \\ S_{2l-2} \end{pmatrix}$$

where $S_0, S_1, \ldots S_{2t-1}$ are the elements of a given $GF(2^m)$, and $\Lambda_i^{(l)}$ is an unknown amount.

In this simultaneous linear equation, the matrix on the left has a regular structure wherein the same elements are arranged obliquely to the right (the direction irtersecting the diagonal line), and is called a Hankel matrix. Generally, this type of equation is called a Yule-Walker equation, and it is known that this equation is widely applied for various fields, such as the error correction code theory, time-series analysis and signal processing. In the error correction algorithm, the Yule-Walker equation appears in the portion for determining an error locator polynomial. Therefore, according to the present invention, the algorithm for obtaining the solution for the Yule-Walker equation is applied as an error correction algorithm for decoding the Reed-Solomon codes.

The well known methods for solving the Yule-Walker equation are, for example, the algorithm proposed by Levinson and the algorithm proposed by Levinson-Durbin. These algorithms start calculating with a matrix of the smallest size l and recursively determine the solution of an equation wherein the size of a matrix is greater. The number of calculations required by these two algorithms is of order of $l^2$. However, these algorithms include divisions in the calculation step. This means that when the algorithm is mounted as a combinational circuit, conditional branches occur depending on whether the denominator is 0 or not. Since a separate circuit must be prepared for each conditional branch, the required circuit size increases as the size of the matrix increases.

Further, as the object of the invention, especially relative to the decoding of the Reed-Solomon codes, an error locator polynomial is determined by obtaining the solution to the Yule-Walker equation. The conventional methods for solving the Yule-Walker equation can be, for example, the Peterson method, the Berlekamp-Massey method and the Euclid method. These methods are used to calculate the coefficients of an error locator polynomial by calculations of which the number is polynomial order with respect to the maximum number of correctable errors t. However, when the Berlekamp-Massey method and the Euclid method are represented by a combinational circuit, the following problems occur.

First, for the Berlekamp-Massey method, it is inevitable that multiple conditional branches should be included in the algorithm. Therefore, to expand this algorithm for a combinational circuit, for the same reason as described above, the circuit size would be increased in accordance with the number of combinations. As for the Euclid method, while the multiplication and division of the polynomial are the essential part of the algorithm and, the degree of a polynomial that appears in the denominator of the division can not be identified in advance, so that there is room for generating a conditional branch. Furthermore, clue to the conditional branches, the circuit size is accordingly increased, as it is for the Berlekamp-Massey method.

B. Policy for Calculating the Yule-Walker Equation and an Error Locator Polynomial that is Appropriate for a Combinational Circuit Since, as is described above, the Levinson(-Durbin) method, the Berlekamp-Massey method and the Euclid method include conditional branches, a problem has arisen in how to provide these methods as combinational circuits. In order to implement the Yule-Walker equation by a combinational circuit, an algorithm that has no conditional branching must be found, and this is an essential object for the algorithm of the invention.

In this case, the Peterson method known for decoding of the Reed-Solomon codes can be used as the algorithm of the invention. Using the Peterson method, the Yule-Walker equation can be solved directly, and the solution of the Yule-Walker equation can be represented as determinants by the Cramer formula:

$$\Lambda_i^{(l)} = \frac{\tilde{\Lambda}_i^{(l)}}{\tilde{\Lambda}_0^{(l)}},\ i = 1, \ldots, l$$

$$\tilde{\Lambda}_0^{(i)} = \begin{vmatrix} S_0 & S_1 & \cdots & S_{l-1} \\ S_1 & S_2 & \cdots & S_l \\ \vdots & \vdots & \ddots & \vdots \\ S_{l-1} & S_l & \cdots & S_{2l-2} \end{vmatrix}$$

$$\tilde{\Lambda}_i^{X(l)} = \begin{vmatrix} S_0 & S_1 & \cdots & S_{l-1} \\ \vdots & \cdots & \ddots & \vdots \\ S_{l-i-1} & S_{l-i} & \cdots & S_{2l-i-2} \\ S_{l-i+1} & S_{l-i+2} & \cdots & S_{2l-i} \\ \vdots & \cdots & \ddots & \vdots \\ S_l & S_{l+1} & \cdots & S_{1l-1} \end{vmatrix},\ i = 1, \ldots, l-1$$

$$\tilde{\Lambda}_i^{(l)} = \begin{vmatrix} S_1 & S_2 & \cdots & S_l \\ S_2 & S_3 & \cdots & S_{l+1} \\ \vdots & \vdots & \ddots & \vdots \\ S_l & S_{l+1} & \cdots & S_{2l-1} \end{vmatrix}.$$

Therefore, determinants $\Lambda_O^{(l)}$ need be obtained for each l=1, . . . , t, and the determinants $\tilde{\Lambda}_i^{(e)}$, i=1, . . . , e need be calculated for the number of errors e.

However, when the expansion of the determinants is provided by using a circuit, the required number of multipliers is dramatically increased as t is increased, so that it is difficult for the determinants to be directly expanded. Therefore, in this invention, the number of calculations is reduced by the recursive structure of the Hankel matrix. The calculation of $\Lambda_i^{nat(l)}$ using the Katayama-Morioka method will be explained.

When the calculation algorithm for $\Lambda_i^{(l)}$ in the Katayama-Morioka method is written for l=1 to l=4, the form in FIG. 14 is obtained.

For comparison, a method devised by Koga will now be described as another method for recursively calculating the Hankel matrix. According to the method by Koga, new error locator polynomial ${}_{i;l+2u}D(X, Y)$ is defined, wherein $${}_{i;i+2u}D(X, Y) = \begin{pmatrix} S_i + YX^i & S_{i+1} + YX^{i+1} & \cdots & S_{i+u} + YX^{i+u} \\ S_{i+1} + YX^{i+1} & S_{i+2} + YX^{i+2} & \cdots & S_{i+u+1} + YX^{i+u+1} \\ \vdots & \vdots & \ddots & \vdots \\ S_{i+u} + YX^{i+u} & S_{i+u+1} + YX^{i+u+1} & \cdots & S_{i+2u} + YX^{i+2u} \end{pmatrix}.$$

To calculate this new error locator polynomial, the Hankel matrix ${}_{i;l+2u}Q$, which has the i-th syndrome $S_l$ as the (1, 1) element, is employed, and a determinant obtained by symmetrically removing multiple rows and columns from this Hankel matrix is defined as a Q determinant. When the subscript numbers of syndromes that appear as a diagonal element are designated in order beginning at the upper left, only one Q determinant can be determined. In this case, the Q determinant can be represented by the row of subscripts $[a_1, a_2, \ldots, a_p]$. According to the Koga method, an algorithm is presented by to calculate error locator polynomial ${}_{i;i+2u}D$ (X, Y) the Q determinant.

All of the above described conventional methods have the following problems. First, for the algorithm used in FIG. 14 for calculating $\Lambda_i^{(l)}$, new terms sequentially appear on the right due to the asymmetry of determinants to be calculated, and as a result, as the size of a matrix is increased, the number of multipliers that is required is increased accordingly. Thus, an algorithm for which the combinatorial increase of the number of multipliers is as small as possible is preferable.

As for the Koga algorithm, the Q determinant defined by Koga is symmetrical, and a reduction in the number of multipliers is carried out. However, there is a limitation on the use of the Koga algorithm; this algorithm can be applied for BCH codes or Reed-Solomon codes only when the minimum distance is an even number. Although it is disclosed in the Koga algorithm that this limitation can be eased, such an application example is limited to the binary, narrow sense BCH code.

According to the invention, since the combinational circuit is applied for an optical communication system, it is required as an object that the decoding of the (255, 239) Reed-Solomon code (minimum distance=17) be efficiently carried out by the combinational circuit. Therefore, an algorithm is needed that can perform an efficient calculation by a specific method, regardless of whether the minimum distance is an odd or even number.

C. Definitions of Terms Used for this Invention

Before a detailed explanation is given for the algorithm of this invention, definitions for the terms used for this invention will be given.

(1) Syndrome

Generally, when a primitive element of the Galois extension field $GF(2^m)$ is defined as a, and $h<2^m-1$ is a positive integer, a $2^m$-element cyclic code that has a code length of $n=2^m-1$ and that employs $$G(x)=(x-1)(x-a)(x-a^2) \ldots (x-a^{h-1})$$

as a generator polynomial is defined as the Reed-Solomon codes. That is, when k=n−h and when the k-th degree polynomial having k information symbols as its coefficients is defined as M(x), M(x) and $x^{n-k}$ are multiplied, and the result is divided by G(x), as follows, to obtain the residue R(x).

$$M(x)x^{n-k}=Q(x)G(x)+R(x)$$

Then, the polynomial (transmission polynomial) that has as coefficients a coded sequence having the length n is defined as $$W(x)=M(x)x^{n-k}-R(x)=Q(x)G(x).$$

At this time, the coded transmission sequence is represented as systematic code, of which k information symbols are located on the left and h=n−k check symbols follow these symbols. The minimum distance $d_{min}$=h+1 of the Reed-Solomon code, and the maximum number of correctable errors t=[h/2] are provided.

The following decoding algorithm is given for making an estimation of the original transmission sequence based on a received sequence.

(2) Calculation of Syndromes and Detection of an Error

Assume that errors have occurred, and that the locations of the errors are denoted by $i_o, \ldots, i_{l-1}$ and the error values are denoted by $E_{i_0}, \ldots, E_{i_{l-1}}$. A polynomial having $E_0, \ldots, E_{i_{l-1}}$ as coefficients is defined as $$E(x)=E_{i_0}x^{l_0}+\ldots+E_{i_{l-1}}x^{1_{l-1}},$$

a polynomial having a received sequence of $b_0, \ldots, b_{n-1}$ as coefficients is provided as $$Y(\chi)=\sum_{i=0}^{n-1} b_i\chi^i = W(\chi)+E(\chi)$$

where Y(x) is defined as a reception polynomial.

Then, the reception polynomial Y(x) is employed to calculate the following syndromes:

$$S_i=Y(a^i)\epsilon GF(2^m),\ i=0, 1, \ldots, 2t-1.$$

In this case, since $W(a^i)=0$, i=0, 1, . . . , 2t−1 is established, and the obtained syndromes satisfy $S_i=E(a^i)$, i=0, 1, . . . , 2t−1. Therefore, when there is no error, all the syndromes are 0, so that the value of syndromes can be used to determine the presence of errors.

(3) Determination of the Number of Errors and the Location of Errors

Assume that the number of errors that occur is 1 and that the location of the error is $i_0, \ldots, i_{l-1}$, i.e., assume that the values of $b_{l_0}, \ldots, b_{i_{l-1}}$ are incorrect. In order to determine the number of errors 1 and the error locations represented by $i_0, \ldots, i_{l-1}$, the following polynomial, having $a^{-l_0}, \ldots, a^{-i_{l-1}}$ as roots, is defined:

$$\Lambda^{(l)}(\chi)=\prod_{k=0}^{l-1}(1-a^{i_k}\chi)=1+\Lambda_1^{(l)}\chi+\ldots+\Lambda_{l-1}^{(l)}\chi^{l-1}+\Lambda_l^{(l)}\chi^l$$

where $a^{-l_0}, \ldots, a^{-l_{l-1}}$ are called error locators and $\Lambda^{(l)}(x)$ is called an error locator polynomial.

Further, $\Lambda_1^{(l)}, \ldots, \Lambda_l^{(l)}$ are coefficients of the error locator polynomial and are provided using the elementary symmetric function of $a^{i_0}, \ldots, a^{i_{l-l}}$.

The unknown quantities $\Lambda_1^{(l)}, \ldots, \Lambda_l^{(l)}$ satisfy the following simultaneous linear equations:

$$\begin{pmatrix} S_0 & S_1 & \cdots & S_{l-1} \\ S_1 & S_2 & \cdots & S_l \\ \vdots & & \ddots & \vdots \\ S_{l-1} & S_l & \cdots & S_{2l-2} \end{pmatrix}\begin{pmatrix} \Lambda_l^{(l)} \\ \vdots \\ \vdots \\ \Lambda_1^{(l)} \end{pmatrix}=\begin{pmatrix} S_l \\ \vdots \\ \vdots \\ S_{2l-1} \end{pmatrix}$$

This is nothing but the Yule-Walker equation explained in section A. While at this step "1 " is an unknown number, it is known that when the number of errors that actually occurred is 1≦e≦t, the Hankel matrix on the left is regular when l=e and is irregular when t≧l>e. Therefore, for l=1, . . . , t, only the determinants for the Hankel matrix on the left need be calculated, and a maximum integer that is not 0 can be defined as the number of errors e. When the above equation is solved with 1=e, the error locator polynomial can be obtained.

In this invention, to specify error locations, the error locators, i.e., the roots of error locator polynomial $\Lambda^{(e)}(x)=0$, need be calculated. For this calculation, a method can be employed whereby $a^{-i}$, i=0, 1, . . . , n−1, is substituted in to determine whether the result is the zero point of the error locator polynomial. This method is called the Chien search method. When the zero point of the error locator polynomial is denoted as $a^{-i_0}, \ldots, a^{-i_{e-1}}$, $i_0, \ldots, i_{e-1}$ provide the actual error locations.

4. Calculation of Error Values

Error values can be obtained by solving the following Vandermonde simultaneous linear equations:

$$\begin{pmatrix} 1 & 1 & \ldots & 1 \\ a^{i_0} & a^{i_1} & \ldots & a^{i_{e-1}} \\ \vdots & \vdots & \ddots & \vdots \\ a^{i_0(e-1)} & a^{i_1(e-1)} & \ldots & a^{i_{e-1}(e-1)} \end{pmatrix}\begin{pmatrix} E_{i_0} \\ \vdots \\ \vdots \\ E_{i_{e-1}} \end{pmatrix}=\begin{pmatrix} S_0 \\ \vdots \\ \vdots \\ S_{e-1} \end{pmatrix}.$$

In this case, polynomial S(x), having a syndrome as a coefficient, is defined as $$S(x)=S_0+S_1x+S_{2t-1}x^{2t-1},$$

and $$\Omega(x)=\Lambda^{(e)}(x)S(x)\bmod x^{2t-1}$$

is defined, wherein Ω(x) is called an error evaluator polynomial. In this case, the solution for the Vandermonde simultaneous linear equation can be obtained by calculating $$E_{i_k}=\frac{\Omega(a^{-i_k})}{\Lambda^i(a^{-i_k})},\ i=0, \ldots, e-1$$

This is called the Forney algorithm. When the error locations and the error values are obtained, only these need be subtracted from an input digital signal, so that a digital signal for which errors were corrected can be output.

D. Algorithm to Solve Yule-Walker Equation of this Invention

The object of the present inventors is to find an efficient algorithm that employs the combinational circuit to obtain the solution for the following Yule-Walker equation, defined over $GF(2^m)$:

$$\begin{pmatrix} S_0 & \cdots & S_{l-1} \\ \vdots & \ddots & \vdots \\ S_{l-1} & \cdots & S_{2l-2} \end{pmatrix} \begin{pmatrix} \Lambda_1^{(l)} \\ \vdots \\ \Lambda_1^{(l)} \end{pmatrix} = \begin{pmatrix} S_1 \\ \vdots \\ S_{2l-1} \end{pmatrix}.$$

where $S_0, S_1, \ldots, S_{2t-1}$ are the elements of a given $GF(2^m)$, and $\Lambda_i^{(1)}$ are unknown amounts.

In this invention, by the Cramer formula the solution for the Yule-Walker equation is represented as the determinant form shown in FIG. 15, and a recursive structure is employed to obtain an efficient method for calculating determinants.

In order to calculate determinants in FIG. 15, the focus in the invention is on the following Jacobi's formula.

Jacobi's Formula $A=(a_{ij})$ is defined as an order n square matrix on a commutative ring having a unit element of 1, and the cofactor (i, j) of A is defined as $\Delta_{ij}$. When $\Delta_{\mu\nu}^{(r)}$ is defined as the cofactor of minor $A_{\mu\nu}^{(r)}$, with a set of subscripts, $$\mu=\{i_1, \ldots, i_r, (i_1< \ldots <i_r)\},\ \nu=\{j_1, \ldots, j_r, (j_1< \ldots <j_r)\},$$

the following equation is established.

$$\begin{vmatrix} \Delta_{i_1 j_1} & \cdots & \Delta_{i_1 j_r} \\ \vdots & \ddots & \vdots \\ \Delta_{i_r j_1} & \cdots & \Delta_{i_r j_r} \end{vmatrix} = (\det A)^{r-1} \Delta_{\mu\nu}^{(n-r)}.$$

In this invention, the following equation $$\Delta_{i_1 j_1} \cdot \Delta_{i_2 j_2} - \Delta_{i_2 j_1} \cdot \Delta_{i_1 j_2} = (\det A) \Delta_{\mu\nu}^{(n-2)}$$

can be employed, which holds when $$\mu=\{i_1, i_2\},\ \nu=\{j_1, j_2\}.$$

The calculation of $\Lambda_i^{hat(l)}$ will now be described using Jacobi's formula.

First, $\Lambda_i^{hat(l+1)}$ is represented in the following form.

$$\tilde{\Lambda}_0^{(l+1)} = \begin{vmatrix} S_0 & S_1 & \cdots & S_{l-1} & S_l \\ S_1 & \ddots & & \vdots & S_{l+1} \\ \vdots & & \ddots & \vdots & \vdots \\ S_{l-1} & \cdots & \cdots & S_{2l-2} & S_{2l-1} \\ S_l & S_{l+1} & \cdots & S_{2l-1} & S_{2l} \end{vmatrix}$$

By careful examination of this determinant, $\Lambda_l^{hat(l)}$ is obtained by removing the (l+1−i)th row and the l-th column from $\Lambda_i^{hat(l+1)}$, and $\Lambda_0^{hat(l)}$ is obtained by removing the l-th row and the l-th column. That is, since $\Lambda_0^{hat(l)}$ and $\Lambda_i^{hat(1)}$ are (l+1, l+1) and (l+1, l+1−i) cofactors of $\Lambda_0^{(l+1)}$ respectively, $$\Delta_{l+1,\,l+1}=\tilde{\Lambda}_0^{(l)},\ \Delta_{l+1,\,l=1-i}=\Delta_{l+1-i,\,l+1}=\tilde{\Lambda}_i^{(l)},$$

while $i_1=j_1=l+1-i$, $i_2=j_2=l+1$ is set in Jacobi's formula. Further, the (l+1−i, l+1−i) cofactor of $\Lambda_0^{hat(l+1)}$ is defined as $\Gamma_l^{(l+1)}$, the structure of which is shown in FIG. 16. And by Jacobi's formula, the following equation is obtained:

$$\Gamma_i^{(l+1)}\tilde{\Lambda}_0^{(l)}+(\tilde{\Lambda}_i^{(l)})^2=\tilde{\Lambda}_0^{(l+1)}\Gamma_{i-1}^{(l)},\ i=1, \ldots, l.$$

When Jacobi's formula is employed, the calculation of $\Lambda^{ihat(l)}$ results in the calculation of $\Gamma_i^{(l+1)}$, which is the determinants of symmetric matrices. It should be noted, however, that, to obtain $\Lambda_l^{hat(l)}$, not only the calculation of $\Gamma_i^{(l+1)}$ but also the 2×l multiplications and the calculation of l square roots are required. Since the calculations for the square root and the square calculations can be performed as linear calculations for $GF(2^m)$, these calculations can be implemented as a circuit substantially at the similar cost as that of an addition. Therefore, only a very small cost is required, compared with a multiplier that is a non-liner operating circuit. Therefore, the present inventors focused on only the multipliers, and discussed the number of them that would be required. Since the characteristic of the $GF(2^m)$ is always 2 and all $\Gamma_i^{(l)}$ are symmetrical, the algorithm proposed here always cancels terms that are generated from arrangements that are asymmetrical to the diagonal line in the process for expanding the cofactor of determinants. For example, when the cofactor expansion is calculated for a 3× 3 symmetric matrix, the following equation is obtained $$\begin{vmatrix} a & b & c \\ b & d & e \\ c & e & f \end{vmatrix} = adf + ae^2 + b^2 f + bec + c^2 d + bec = adf + ae^2 + b^2 f + c^2 d$$

Since the term "bec", which is generated from the arrangement asymmetrical to the diagonal line, always appears twice, this term is canceled. Thus, when the algorithm of the invention is used for a combinational circuit including multipliers, the required number of multipliers can be reduced.

The general form of the algorithm for the recursive calculation of $\Gamma_i^{(l)}$, l=1, 2, . . . , t+1, i=0, 1, . . . , t, is provided as follows.

0. $\Gamma_1^{(1)}=1$, $\Gamma_0^{(2)}=S_0$, $\Gamma_1^{(2)}=S_2$ 1. when 1>2, i=1, $$\Gamma_0^{(l)} = S_{2l-4}\Gamma_0^{(l-1)} + \sum_{k=1}^{l-2} S_{2l-4-k}^2 \Gamma_{k-1}^{(l-2)}.$$

2. when 1>2, i=1, . . . , l−1, first, one auxiliary amount for describing the algorithm is defined.

When $\{i_1, \ldots, i_n\}$ is defined as a set of subscripts, $\det[\{i_1, \ldots, i_n\}]$ is defined as $$\det[\{i_1, \ldots, i_n\}] = \begin{vmatrix} S_{i_1} & S_{i_2} & \cdots & S_{i_n} \\ S_{i_2} & S_{2i_2-i_1} & \cdots & S_{i_2+i_n-i_1} \\ \vdots & \vdots & \ddots & \vdots \\ S_{i_n} & S_{i_2+i_n-i_1} & \cdots & S_{2i_n-i_1} \end{vmatrix}$$

Specifically, $\det[\{i_1, \ldots, i_n\}]$ is the determinant of a symmetric matrix wherein the first row is $S_{i_1}, \ldots, S_{i_n}$ and the (p, q) element is $S_{i_p+i_q-i_l}$. This determinant is obtained by symmetrically removing several rows and columns from the Hankel determinant $\Lambda_0^{(l)}$. And $\Gamma_i^{(l)}$ is calculated by using $\det[\{i_1, \ldots, i_n\}]$ as follows.

$$\Gamma_i^{(l)} = S_{2l-2}\Gamma_{i-1}^{(l-1)} + \sum_{k=1,k\neq i}^{l-1} S_{2l-2-k}^2 \det[\{0, 1, \ldots, l-2\} - \{l-1-i, l-1-k\}].$$

In this equation, det [{0, 1, . . . , 1−2}−{1-1-i, 1-1-k}] is the determinant for a symmetric matrix that is obtained by symmetrically removing, from $\Gamma_i^{(l-1)}$, l-1-i and l-1-k rows and l-1-i and l-1-k columns. Note that, when k=1 and i=1, the determinant matches expression of $\Gamma_{l-2}^{(l-2)}$, $\Gamma_{k-2}^{(l-2)}$.

3. Generally, det[{$i_1$, . . . , $i_n$}] is calculated as follows.

$$\det[\{i_1, \ldots, i_n\}] = S_{2i_n-i_i}\det[\{i_1, \ldots, i_{n-1}\}] + \sum_{k=1}^{n-1} S_{i_n-i_1+i_k}^2 \det[\{i_1, \ldots, i_{n-1}\} - \{i_k\}].$$

E. Application of the Algorithm of the Invention for the Decoding of the Reed-Solomon Code An explanation will now be given for the embodiment wherein the algorithm of the invention for solving the Yule-Walker equation described in D is applied for the Reed-Solomon codes. Generally, it is assumed that the order of the Yule-Walker equation (the number of unknown quantities) is known. However, for the decoding of the Reed-Solomon codes, since the order is also unknown, this must also be determined.

(1) Calculation of $\Gamma_l^{(l)}$

When a sequence of syndromes, $S_0$, $S_1$, . . . , $S_{2t-1}$, is provided, $$\Gamma_i^{(l)},\ l=1, 2, \ldots, t+1,\ i=0, \ldots, t$$

is calculated in accordance with the algorithm explained in D. During this Calculation, $$\tilde{\Lambda}_0^{(l)}=\Gamma_0^{(l+1)},\ l=1, \ldots, t$$

is also calculated. It should be noted that for fast decoding of the Reed-Solomon code, the present inventors have taken into consideration the fact that the algorithm is implemented as a combinational circuit. However, use of the error correction algorithm of the invention is not limited to the combinational circuit; it can be employed as an error correction device by a sequential circuit.

(2) Determination of the Number of Errors

Assume that the number of errors that actually occurred is represented as e. Based on the value of $$\tilde{\Lambda}_0^{(l)}=\Gamma_0^{(l+1)},\ l=1, \ldots, t,$$

e can be obtained as the maximum "l" that satisfies $\Lambda_0^{hat(l)}\neq 0$.

(3) Determination of an Error Locator Polynomial

When e<t is established as the result of the determination of the number of errors, since $\Lambda_0^{hat(e+1)}$32 0, in accordance with the algorithm of the invention, the above equation can be simplified as follows:

$$\tilde{\Lambda}_i^{(e)}=\sqrt{\Gamma_i^{(e+1)}\Lambda_0^{(e)}},\ i=1, \ldots, e.$$

Since the error locator is the zero point of the error locator polynomial, the error locators are values unchanged by multiplication of the coefficients of the error locator polynomial by a constant. Therefore, the following quantity $$\sqrt{\Gamma_i^{(e+1)}}$$

can be used instead of $\Lambda_i^{hat(e)}$. In other words, the multiplication appearing in the above equation is not required. When e=t is established, the error locator polynomial is calculated in accordance with the following equation:

$$\tilde{\Lambda}_i^{(e)}=\sqrt{\Gamma_i^{(e+1)}\Lambda_0^{(e)}}+\tilde{\Lambda}_0^{(e+1)}\Gamma_{i-1}^{(e)},\ i=1, \ldots, e.$$

At this time, according to the algorithm proposed by the present inventors, in appearance, syndrome $S_{2t}$, which can not be calculated, seems to be necessary when the minimum distance is an odd number (=2t+1). However, since the equation of this invention serves as the identity of the syndromes, it can also serve as the identify of the syndrome $S_{2t}$. Furthermore, since $\Lambda_i^{hat(t)}$ does not include syndrome $S_{2t}$, when syndrome $S_{2t}$ appears during the cofactor expansion for $\Lambda_0^{hat(t+1)}$ and $\Gamma_l^{(t+1)}$, it should always be canceled. Specifically, since a term that includes $S_{2t}$ and that appears during the cofactor expansion of $\Gamma_i^{(t+1)}$ is $\Gamma_{i-1}^{(t)}S_{2t}$, when $\Gamma^{(t+1)}\Lambda_0^{hat(t)}$ is expanded, a term including $S_{2t}$ is $\Lambda_0^{hat(t)}\Lambda_{i-1}^{(t)}S_{2t}$. Further, since, of the terms that appear during the cofactor expansion of $\Lambda_0^{hat(t+1)}$, $\Lambda_0^{hat(t)}S_{2t}$ includes $S_{2t}$, a term including $S_{2t}$ when $\Lambda_0^{(t+1)}\Gamma_{i-1}^{(t)}$ is expanded is $\Lambda_0^{hat(t)}\Gamma_{i-1}^{(t)}S_{2t}$. Therefore, all these terms must always be canceled.

It is therefore understood that, of the terms that appear during the cofactor expansion of $\Lambda_0^{(t+1)}$ and $\Gamma_i^{(t+1)}$, terms having $S_{2t}$ as a coefficient need not be calculated. In this manner, the algorithm of the invention can be applied for Reed-Solomon codes having an arbitrary minimum distance. Further, since the multiplication of the term including $S_{2t}$ is not necessary, from the viewpoint of the reduction in the number of multipliers, the algorithm of the invention is superior to the Koga algorithm. In addition, as is described above, the calculation of a square root can be implemented as a circuit at the same cost as that for addition, and only a small cost is required compared with the cost of a multiplier.

F. Example of Application of the Error Correction Algorithm of the Invention for the Decoding of Reed-Solomon Codes An explanation will now be given for a case wherein the error correction algorithm explained in E. is employed for the decoding of Reed-Solomon code for t=4. When t=4, according to the invention the following equations are determined. It should be noted that for simplification the determinant is represented as det [{$i_1$, . . . , $i_n$}]=det$i_1$. . . $i_n$.

(1) Calculation of $\Gamma_i^{(l)}$, i=0, . . . , 1−1, . . . , 5

The calculation results obtained by the invention are shown in FIG. 17.

(2) Determination of the Number of Errors

Since $\tilde{\Lambda}_0^{(l)}=\Gamma_0^{(l+1)}$, l=1, . . . , 4 is determined by $\Gamma_i^{(l)}$, obtained in (1), and the number of errors e can be determined as the maximum 1, l=1, 2, 3, 4, that satisfies $$\tilde{\Lambda}_0^{(l)}\neq 0.$$

(3) Determination of an Error Locator Polynomial

When, for example, e=2 is ascertained using the calculation in (2), the error locator $a^{i_0}$, $a^{i_l}$ can be obtained by solving the following algebraic equation:

$$\sqrt{\tilde{\Lambda}_0^{(2)}}+\sqrt{\Gamma_1^{(3)}}\chi+\sqrt{\Gamma_2^{(3)}}\chi^2=0$$

When e=4 is ascertained, as is described above, the error locator can be obtained by $$\tilde{\Lambda}_i^{(4)}=\sqrt{\Gamma_i^{(5)}\Lambda_0^{(4)}}+\tilde{\Lambda}_0^{(5)}\Gamma_{i-1}^{(4)},\ i=1, 2, 3, 4$$

It should be noted that, as is described above, the term including the syndrome $S_8$ need not be calculated when the $\Gamma_i^{(5)}$, $\Gamma_0^{(6)}=\tilde{\Lambda}_0^{(5)}$ calculations are performed.

Figure 18:
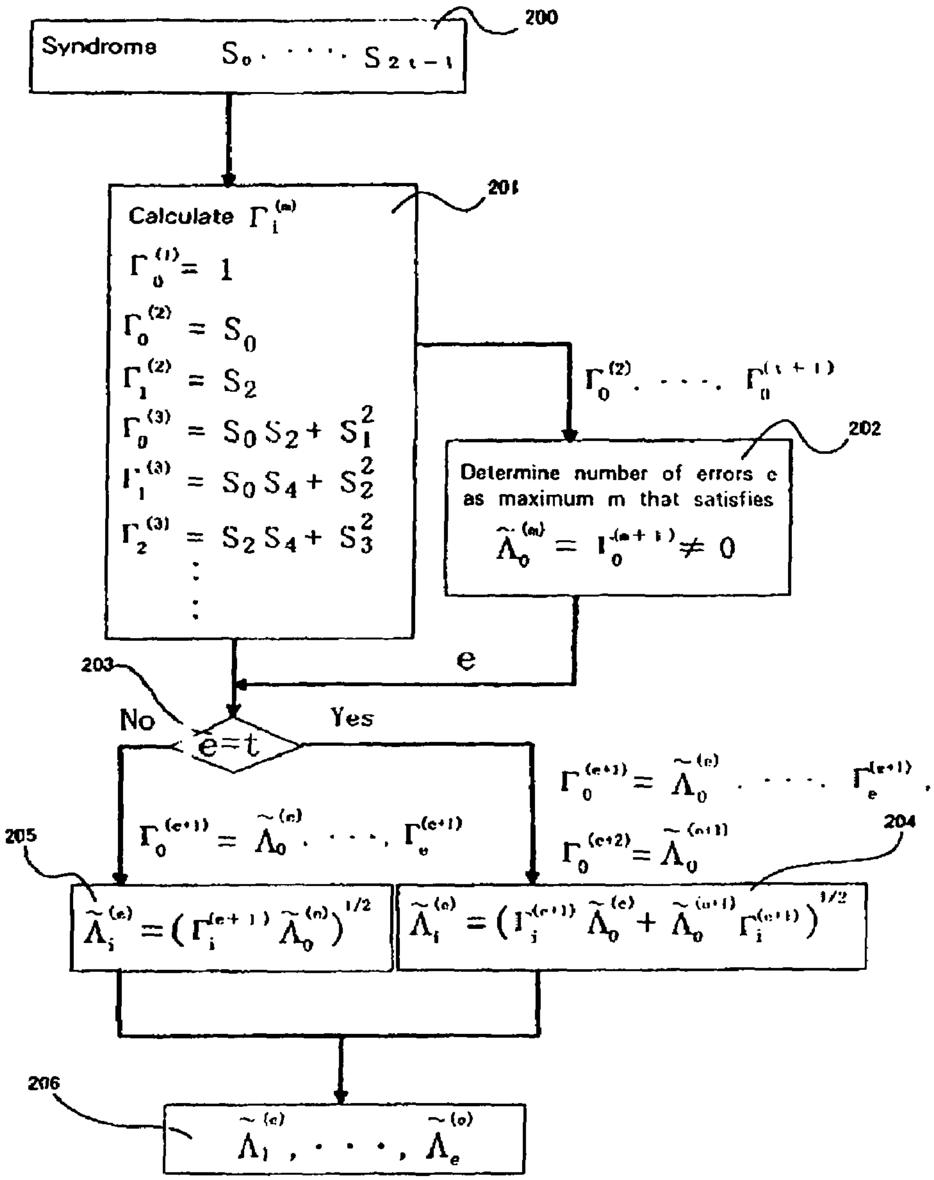
FIG. 18 is a schematic flowchart for an error correction algorithm according to the present invention.

FIG. 18 is a schematic flowchart for the error correction algorithm of the invention. In the error correction algorithm of the invention, first, at step 200 syndromes $S_0, \ldots, S_{2t-1}$ are input, and at step 201 an error locator polynomial $\Gamma$ is calculated. When $\Gamma_0^{(2)}, \ldots, \Gamma_0^{(t+1)}$ are obtained, at step 202 the number of errors is determined to be the maximum integer m that satisfies $\Lambda_0^{hat(m)}=\Gamma_0^{(m+1)}\neq 0$. Then, at step 203, a check is performed to determine whether the number of errors e is equal to the maximum number of errors, and when e=t (yes), at step 204 an error value is calculated using $\Gamma_0^{(e+1)}=\Lambda_0^{hat(e)}, \ldots, \Gamma_e^{(e+1)}, \Gamma_0^{(e+2)}=\Lambda_0^{hat(e+1)}$. Whereas when e≠t (no), at step 205 an error value is calculated by only $\Gamma_0^{(e+1)}=\Lambda_0^{hat(e)}, \ldots, \Gamma_e^{(e+1)}$, and at step 206, $\Lambda_0^{hat(e)}, \ldots, \Lambda_e^{hat(e)}$ is obtained.

Figure 19:
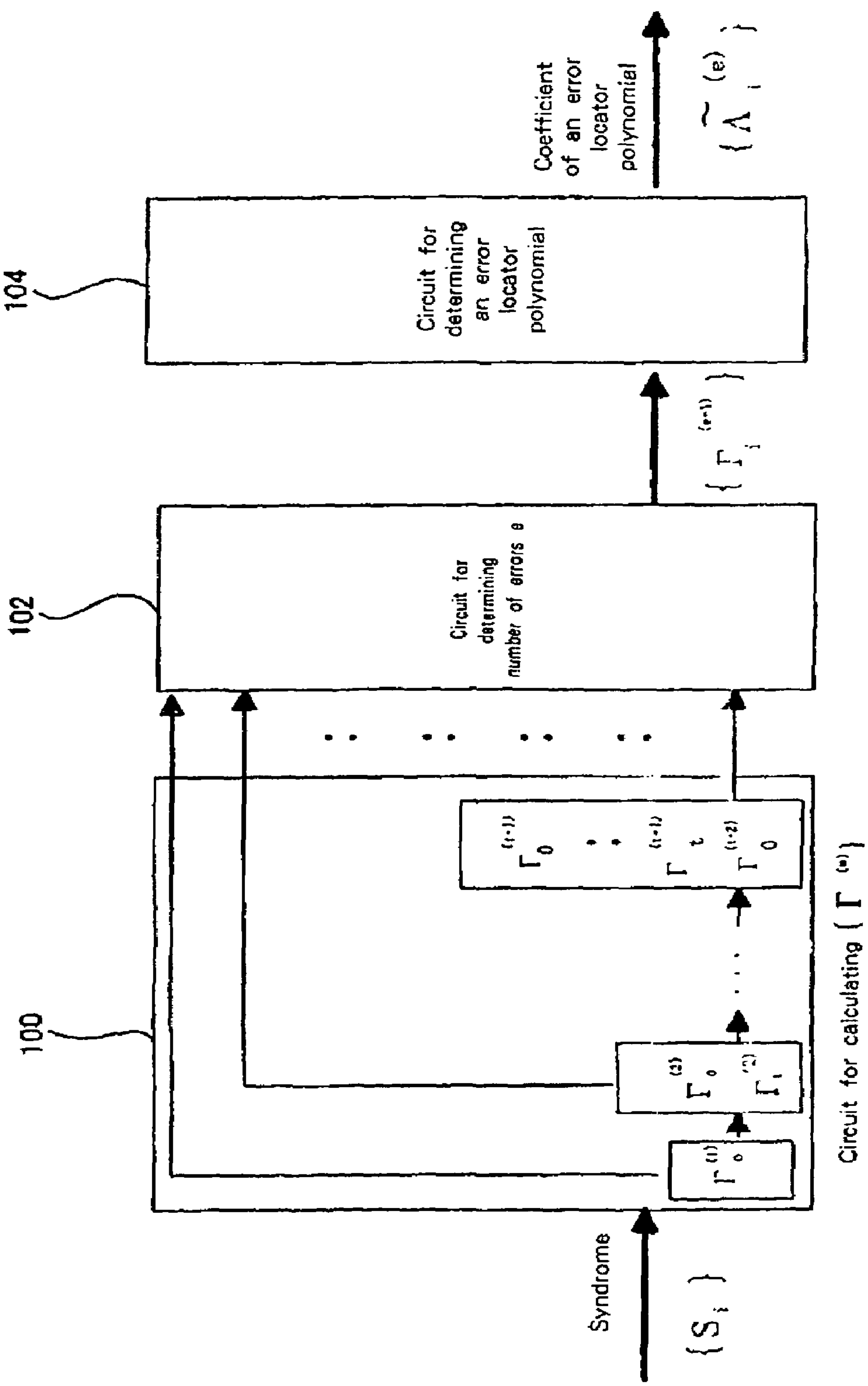
FIG. 19 is a schematic diagram showing the configuration of a Reed-Solomon code decoder according to the invention.
Figure 20:
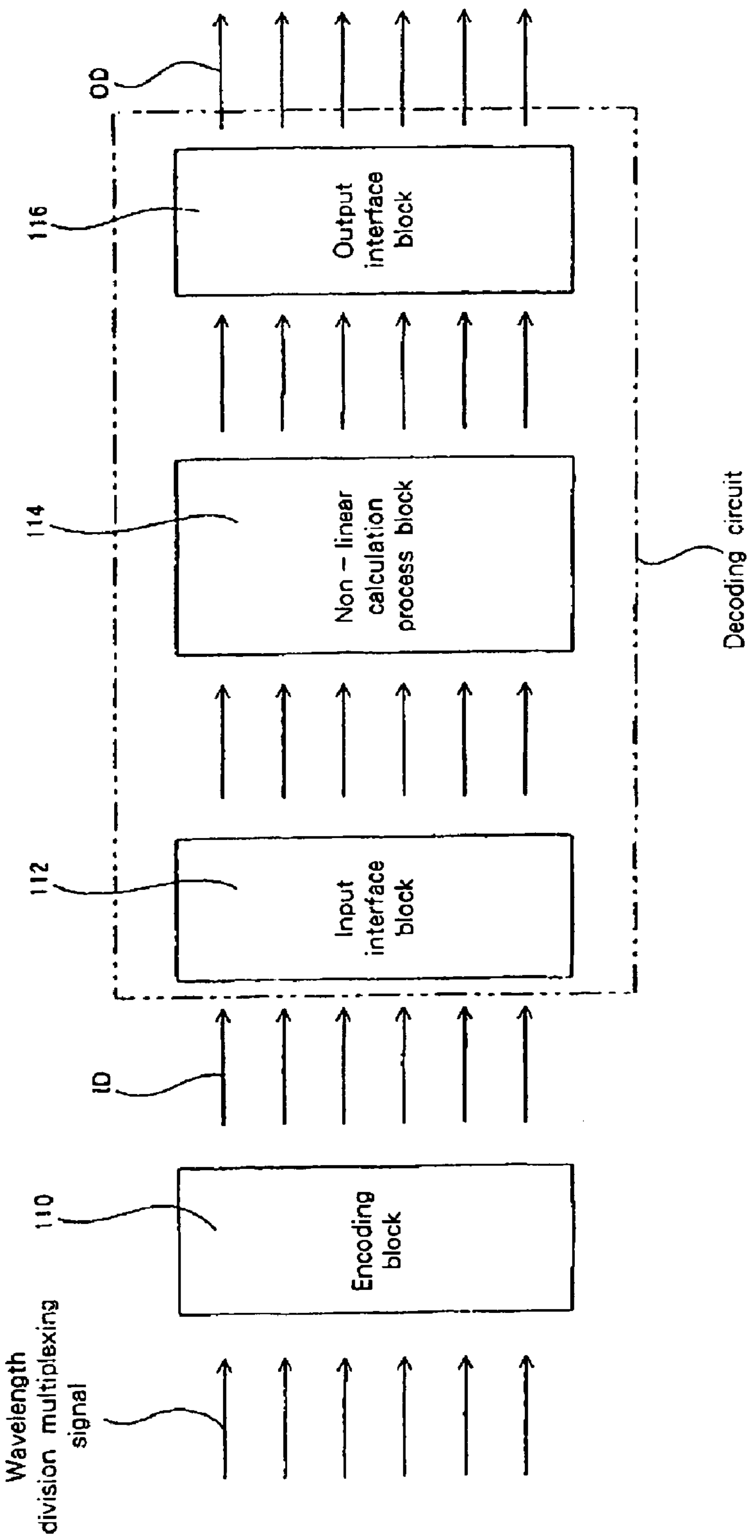
FIG. 20 is a schematic block diagram showing the configuration of an error correction device according to the invention.

G. Calculation Circuit when the Algorithm of the Invention is Applied for the Calculation of an Error Locator Polynomial FIG. 19 is a block diagram showing a circuit for calculating an error locator polynomial based on the algorithm proposed by the invention. FIG. 20 is a diagram showing a circuit for calculating an error locator polynomial by the algorithm of the invention. This circuit comprises a $\{\Gamma_i^{(m)}\}$ calculation block 100, a circuit block 102 for calculating the number of errors and a circuit block 104 for determining an error locator polynomial.

The functions of the blocks in FIG. 19 will now be described. A series of syndromes that a sequential circuit has obtained using the input digital signal are transmitted to the circuit block 100. In the circuit block 100, these syndromes yield $\Gamma_i^{(m)}$, m=1, 2, . . . , t+1, i=0, . . . , t, in accordance with the algorithm of the invention. This corresponds to (1) for the detailed explanation of the algorithm.

Following this, the circuit block 102 employs the obtained value $\Gamma_0^{(m)}$, m=1, 2, . . . , t+1 to calculate the number of errors e, and outputs $\Gamma_i^{(e+1)}$, i=0, . . . , e, which corresponds to the value of e. When e=t, in addition to the above, $\Gamma_0^{(t+2)}=\tilde{\Lambda}_0^{(t+1)}$ is also output. This corresponds to detailed explanation (2) for the algorithm. The circuit block 104 then employs $\Gamma_i^{(e+1)}$, i=0, . . . , e to calculate the coefficients of the error locator polynomial. This calculation is performed in accordance with the process corresponding to detailed explanation (3) for the algorithm.

The algorithm of the invention has been used for the combinational circuit in order to perform fast decoding of the Reed-Solomon codes. However, the algorithm of the invention can also be used for a sequential circuit in order to reduce the circuit size.

H. Circuit Size when the Algorithm of the Invention is Used for the Decoding of the Reed-Solomon Codes An explanation will now be given for the size of a circuit when the algorithm of the present invention is used for the decoding of the Reed-Solomon codes. As is described above, the calculation of square roots and the calculation of squares can be performed by a circuit having substantially the same cost as an addition circuit, and compared with a multiplier, the cost required is very small. The present inventors have focused only on the multipliers, and discussed the number of multipliers that are required.

Table 4 shows the number of multipliers required by the algorithm of the invention in a range extending from t=1 to t=8. In Table 4, for comparison, the number of multipliers required for each of the conventional examples 1 and 2 is also shown.

TABLE 4

Comparison of the number of multipliers

| Maximum number of correctable errors t | 1 | 2 | 3 | 4 | 5 | 6 | 7 | 8 |
|---|---|---|---|---|---|---|---|---|
| Algorithm for conventional example 1 | 0 | 3 | 17 | 48 | 117* | 255* | 548* | 1111* |
| Algorithm for conventional example 2 | 2 | 9 | 22 | 49 | 98 | 189 | 351 | 640 |
| Algorithm of the invention | 2 | 7 | 21 | 46 | 94 | 179 | 331 | 597 |

Note:
a value having an appended * is an estimated one

As is apparent from Table 4, while taking the required number of multipliers into account, the algorithm proposed in this invention is superior in all number of errors t to the algorithm (conventional example 2) proposed by Koga. Further, the use of an algorithm for the decoding of (255, 239) Reed-Solomon code (t=8) is especially important for the optical communication field; however, the Koga algorithm can not be so employed because the minimum distance of Reed-Solomon code is an odd number (=17). Since the algorithm of the invention can be used for Reed-Solomon codes having an arbitrary minimum distance, it can also be used for (255, 239) Reed-Solomon code. This is shown in Table 5.

TABLE 5

Comparison of the application ranges of the Koga algorithm and the algorithm of the invention

| Minimum distance of code | . . . | 15 | 16 | 17 | 18 | . . . |
|---|---|---|---|---|---|---|
| Koga algorithm | . . . | x | ○ | x | ○ | . . . |
| Proposed algorithm | . . . | ○ | ○ | ○ | ○ | . . . |

(x indicates the algorithm can not be used, and ○ indicates the algorithm can be used. While the Koga algorithm can be used only for code having an even minimum distance, the proposed algorithm can be used for code having an arbitrary minimum distance. (255, 239) Reed-Solomon code standardized by the ITU has a minimum distance of 17.)

The calculation algorithm in conventional example 1 (Katayama-Morioka) can also be used for Reed-Solomon code having an arbitrary minimum distance. However, from the viewpoint of the required number of multipliers into account, when t is equal to or greater than 4, the algorithm proposed in this invention requires a smaller number of multipliers than does the algorithm of conventional example 1. It has especially been found that when t=8, the algorithm of the invention can reduce the number of multipliers by about 50%. And as for a circuit size, when t=8, 10K gates are currently required for the calculation of the error values. For conventional example 1 about 80K gates seem to be required, while the employment of the algorithm of the invention can reduce the gates for the calculation of an error polynomial to about 40K gates.

FIG. 20 is a schematic diagram showing an error correction device according to the invention. The error correction device in FIG. 20 comprises: an encoding block 110, for receiving and encoding a digital signal; an input block 112, for receiving the encoded digital signal ID and for calculating syndromes; a process block 114, including a decoding circuit; and an output block 116, for correcting an error using an error location and an error value that are output and for outputting the resultant digital signal OD. The encoding block 110 receives the digital signal, which is transmitted by interleaved wavelength division multiplexing, converts the signal into Reed-Solomon codes, for example, and transmits the encoded digital signal to the input block 112. The input block 112 employs a sequential circuit to calculate syndromes for the received digital signal, and transmits the syndromes to the process block 114.

The process block 114 includes a decoding function employing the algorithm of the invention, and calculates error locations and error values. The error locations and the error values that are obtained are transmitted to the output block 116, the error is corrected, and the resultant digital signal is output. The above described error correction circuit can be provided as an error correction device comprising multiple hardware components, or a semiconductor technique may be employed to provide a semiconductor device, such as an ASIC, for which the individual functional blocks of the error correction circuit are implemented on a silicon wafer. In addition, the algorithm of the invention can be mounted as firmware for the error correction device, or may be provided as a computer-readable program that is recorded on a storage medium, such as a floppy disk, a hard disk, an optical disk or a magneto-optical disk. The program of the invention may be written in an arbitrary object-oriented language or a programming language such as C, and stored on the above mentioned storage medium.

As is described above, according to the present invention, it is possible to provide a combinational circuit that can extremely efficiently correct errors in the fast optical communication field, and an encoder, a decoder and a semiconductor device that employ this combinational circuit.

| Description of the Symbols | |
|---|---|
| 10: | Input unit |
| 12: | Processor |
| 14: | Output unit |
| 16: | Syndrome calculator |
| 18: | Error locator polynomial calculator |
| 18a: | Register |
| 20: | Error value polynomial calculator |
| 22: | Register |
| 24: | AND gate |
| 26: | XOR gate |
| 23a, 28b: | imn buffer |
| 40, 42: | Multiplier |
| 45a, 45b, 62, 64: | Output |
| 46: | Multipliers |
| 47: | Adder group |
| 52, 54, 56, 60a, 60b: | XOR group |
| 60: | Downstream XOR group |
| 66, 68, 70, 72, 77, 78: | Input |
| 80, 82: | AND group |
| 84: | Addition circuit |

What is claimed is:

1. A combinational circuit comprising:

a plurality of multipliers, independently performing two or more multiplications for coded digital signals in a Galois extension field GF($2^m$), where m is an integer equal to or greater than 2, wherein said multipliers include an input side XOR calculator, an AND calculator, and an output side XOR calculator, and wherein said multipliers share said input side XOR calculator.

2. The combinational circuit according to claim 1, wherein the input of said multipliers is commonly used.

3. The combinational circuit according to claim 1, that is used for:

an error location calculator that calculates an error location for a digital signal transmitted using wavelength division multiplexing, and for an error value calculator.

4. The combinational circuit according to claim 1, wherein syndromes obtained by said coded digital signal are input.

5. The combinational circuit according to claim 1, that is used for at least one of decoding, error correction and encryption.

6. The combinational circuit according to claim 1, that is used for a coding circuit and a decoding circuit for cryptography.

7. A combinational circuit for performing a logical sum calculation for Galois extension field GF($2^m$), where m is an integer equal to or greater that 2, comprising:

a plurality of multipliers, each of which includes an adder connected between an AND calculator and an output side XOR calculator, wherein said output side XOR calculator is used in common, and wherein outputs of said AND calculators in said multipliers are added by said adders, and addition results are calculated by said output side XOR calculator that is used in common.

8. The combinational circuit according to claim 7, wherein said multipliers have an input that is commonly used, and said input side XOR calculator is used in common by said multipliers.

9. The combinational circuit according to claim 7, that is used for:

an error location calculator for calculating an error location for a digital signal transmitted using wavelength division multiplexing, and an error value calculator.

10. The combinational circuit according to claim 7, wherein syndromes obtained by said coded digital signal are input.

11. The combinational circuit according to claim 7, that is used for at least one of decoding, error correction and encryption.

12. The combinational circuit according to claim 7 that is used for a coding circuit and a decoding circuit for cryptography.

13. An encoder including the combinational circuit according to claim 1 or claim 7.

14. A decoder including the combinational circuit according to claim 1 or claim 7.

15. A semiconductor device used for processing a digital signal, said device comprising:

input means, for receiving a coded digital signal;

processing means, for processing said coded digital signal and for calculating coefficients of error locator polynomial and coefficients of error value polynomial; and output means, for outputting a digital signal obtained by correcting errors using said coefficients of error locator polynomial and said coefficients of error value polynomial, wherein said input means is constituted by a sequential circuit, and said processing means is constituted by a combinational circuit, and wherein said combinational circuit includes:

a plurality of multipliers, independently performing two or more multiplications for coded digital signals in a Galois extension field $GF(2^m)$, where m is an integer equal to or greater than 2, wherein said multipliers include an input side XOR calculator, an AND calculator, and an output side XOR calculator, and wherein said multipliers share said input side XOR calculator.

16. The semiconductor device according to claim 15, wherein said multipliers have commonly used input, and said input side XOR calculator is used in common by said multipliers.

17. The semiconductor device according to claim 15, wherein said combinational circuit is used for an error location calculator, for calculating an error location for a digital signal transmitted using wavelength division multiplexing, and for an error value calculator.

18. The semiconductor device according to claim 15 that is used for at least one of decoding, error correction and encryption.

19. A semiconductor device used for processing a digital signal, said device comprising:

input means, for receiving a coded digital signal;

processing means, for processing said coded digital signal and for calculating coefficients of error locator polynomial and coefficients of error value polynomial; and output means, for outputting a digital signal obtained by correcting errors using said coefficients of error locator polynomial and said coefficients of error value polynomial, wherein said input means is constituted by a sequential circuit, and said processing means is constituted by a combinational circuit, and wherein said combinational circuit includes:

a logical sum calculator for a Galois extension field $GF(2_m)$, where m is an integer equal to or greater than 2, wherein said multipliers include an adder connected between said AND calculator and said output side XOR calculator, wherein said output side XOR calculator is used in common, and wherein outputs of said AND calculators in said multipliers are added by said adders, and addition results are calculated by said output side XOR calculator that is used in common.

* * * * *